(12) United States Patent
Mishra et al.

(10) Patent No.: US 10,303,643 B2
(45) Date of Patent: May 28, 2019

(54) ENHANCED VIRTUAL GPIO WITH MULTI-MODE MODULATION

(71) Applicant: QUALCOMM Incorporated, San Diego, CA (US)

(72) Inventors: Lalan Jee Mishra, San Diego, CA (US); Richard Wietfeldt, San Diego, CA (US); Mohit Prasad, San Diego, CA (US); James Panian, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/165,966

(22) Filed: Oct. 19, 2018

(65) Prior Publication Data

US 2019/0087380 A1    Mar. 21, 2019

Related U.S. Application Data

(62) Division of application No. 15/097,237, filed on Apr. 12, 2016, now Pat. No. 10,146,727.

(60) Provisional application No. 62/147,238, filed on Apr. 14, 2015, provisional application No. 62/233,278, filed on Sep. 25, 2015.

(51) Int. Cl.
| G06F 13/40 | (2006.01) |
| G06F 13/42 | (2006.01) |
| G06F 13/38 | (2006.01) |
| G06F 13/16 | (2006.01) |
| H03M 13/19 | (2006.01) |

(52) U.S. Cl.
CPC ...... *G06F 13/4282* (2013.01); *G06F 13/1678* (2013.01); *G06F 13/385* (2013.01); *H03M 13/19* (2013.01); *Y02D 10/14* (2018.01); *Y02D 10/151* (2018.01)

(58) Field of Classification Search
CPC .............. G06F 13/1678; G06F 13/385; G06F 13/4282; H03M 13/19; Y02D 10/14; Y02D 10/151
See application file for complete search history.

(56) References Cited

U.S. PATENT DOCUMENTS

| 5,434,719 | A | 7/1995 | Miller et al. |
| 7,373,111 | B2 | 5/2008 | Gupta |
| 8,560,753 | B1 | 10/2013 | Hobbs et al. |
| 9,417,801 | B2 * | 8/2016 | Adams .................. G06F 13/385 |
| 2003/0061431 | A1 | 3/2003 | Mears et al. |
| 2003/0169738 | A1 | 9/2003 | McDaniel et al. |
| 2004/0095112 | A1 | 5/2004 | Kernahan et al. |
| 2008/0278508 | A1 | 11/2008 | Anderson et al. |
| 2014/0108679 | A1 | 4/2014 | Mishra et al. |
| 2014/0330994 | A1 | 11/2014 | Mishra et al. |
| 2015/0149672 | A1 | 5/2015 | Mishra et al. |

(Continued)

OTHER PUBLICATIONS

International Search Report and Written Opinion—PCT/US2016/027377—ISA/EPO—dated Aug. 8, 2016.

(Continued)

*Primary Examiner* — Idriss N Alrobaye
*Assistant Examiner* — Richard B Franklin
(74) *Attorney, Agent, or Firm* — Haynes and Boone, LLP

(57) ABSTRACT

A multi-modulation scheme is provided that combines pulse-width modulation and phase modulation to transmit a plurality of GPIO signals as virtual GPIO signals.

8 Claims, 16 Drawing Sheets

(56) References Cited

U.S. PATENT DOCUMENTS

2015/0293829 A1 10/2015 Culshaw et al.
2015/0301979 A1 10/2015 Mishra et al.
2016/0306770 A1 10/2016 Mishra et al.

OTHER PUBLICATIONS

European Search Report—EP18185595—Search Authority—Munich—dated Oct. 24, 2018.

* cited by examiner

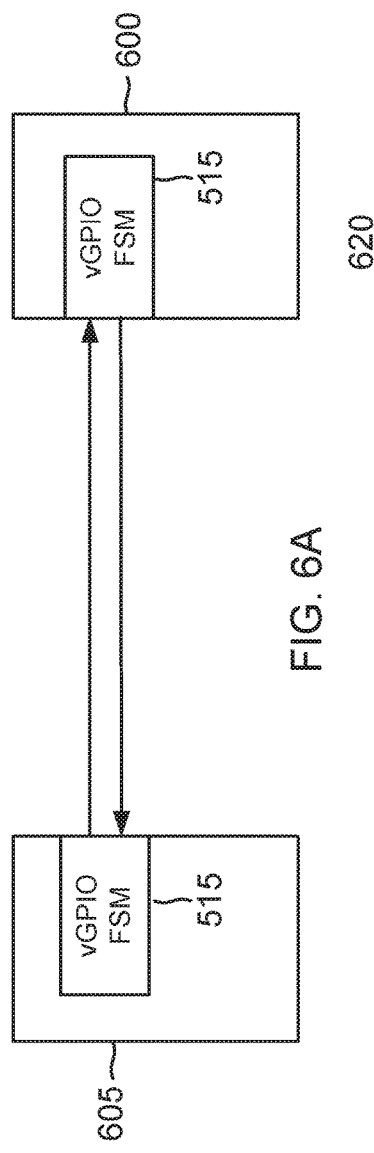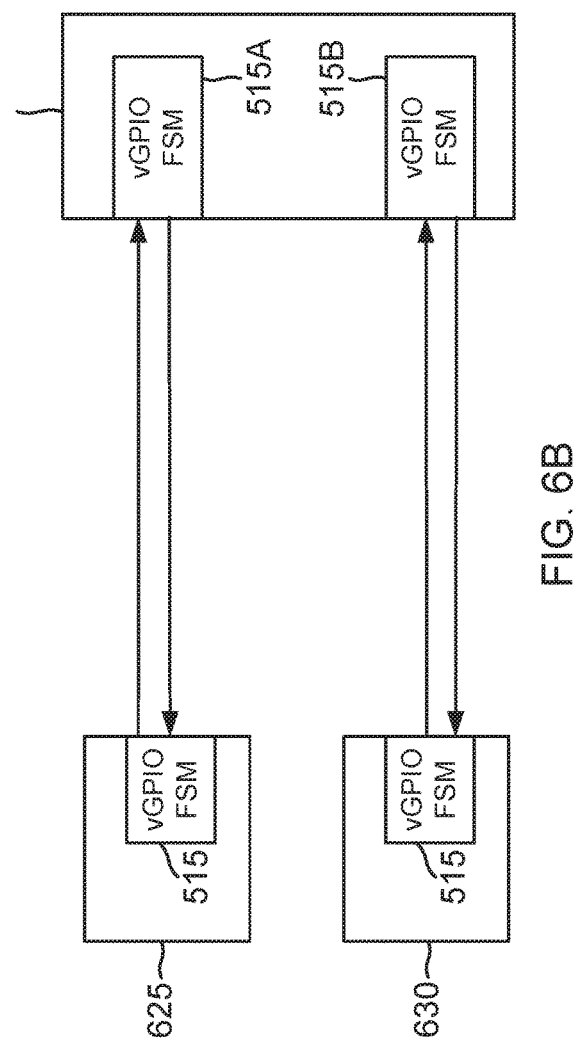

| Code | D0 | D1 | D2 | D3 | D4 | D5 | D6 | D7 | Hex Value | Function |
|---|---|---|---|---|---|---|---|---|---|---|
| Code-0 | 0 | 0 | 0 | 0 | 0 | 0 | 0 | 0 | 0X00 | Soft Reset |
| Code-1 | 1 | 0 | 0 | 0 | 1 | 1 | 1 | 0 | 0X71 | Broadcast |
| Code-2 | 0 | 1 | 0 | 0 | 1 | 0 | 1 | 1 | 0XD2 | Addressed I/O Packet |
| Code-3 | 0 | 0 | 1 | 0 | 1 | 1 | 0 | 1 | 0XB4 | Addressed Message Packet |
| Code-4 | 0 | 0 | 0 | 1 | 0 | 1 | 1 | 1 | 0XE8 | Lowest Speed Mode |
| Code-5 | 1 | 1 | 0 | 0 | 0 | 1 | 0 | 1 | 0XA3 | RFU |
| Code-6 | 1 | 0 | 1 | 0 | 0 | 0 | 1 | 1 | 0XC5 | Addressed ACK |
| Code-7 | 1 | 0 | 0 | 1 | 1 | 0 | 0 | 1 | 0X99 | Direct ACK |
| Code-8 | 0 | 1 | 1 | 0 | 0 | 1 | 1 | 0 | 0X66 | Direct NAK |
| Code-9 | 0 | 1 | 0 | 1 | 1 | 1 | 0 | 0 | 0X3A | Addressed NAK |
| Code-10 | 0 | 0 | 1 | 1 | 1 | 0 | 1 | 0 | 0X5C | RFU |
| Code-11 | 1 | 1 | 1 | 0 | 0 | 0 | 0 | 0 | 0X27 | Direct FCOM |
| Code-12 | 1 | 1 | 0 | 1 | 0 | 0 | 1 | 0 | 0X4B | Direct Message Packet |
| Code-13 | 1 | 0 | 1 | 1 | 0 | 1 | 0 | 0 | 0X2D | Direct I/O Packet |
| Code-14 | 0 | 1 | 1 | 1 | 0 | 0 | 0 | 1 | 0X8E | Listen Only Query |
| Code-15 | 1 | 1 | 1 | 1 | 1 | 1 | 1 | 1 | 0XFF | Lowest Speed Mode |

VGI Function Header Table

FIG. 12

ENHANCED VIRTUAL GPIO WITH MULTI-MODE MODULATION

CROSS REFERENCE TO RELATED APPLICATIONS

This application is a divisional of U.S. application Ser. No. 15/097,237, filed Apr. 12, 2016, which claims the benefit of U.S. Provisional Application No. 62/147,238, filed Apr. 14, 2015 and further claims the benefit of U.S. Provisional Application No. 62/233,278, filed Sep. 25, 2015.

TECHNICAL FIELD

This application relates to signaling, and more particularly to a multi-modulation digital signaling scheme combining pulse width modulation and phase modulation.

BACKGROUND

General purpose input/output (GPIO) enables an integrated circuit designer to provide generic pins that may be customized for particular applications. For example, a GPIO pin is programmable to be either an output or an input pin depending upon a user's needs. A GPIO host or peripheral will typically control groups of pins which can vary based on the interface requirement. Because of the programmability of GPIO pins, they are often included in microprocessor and microcontroller applications. For example, an applications processor in a mobile device may use a number of GPIO pins to conduct handshake signaling such as inter-processor communication (IPC) with a modem processor.

With regard to such handshake signaling, a sideband signal is deemed as "symmetric" if it must be both transmitted and received by a processor. If there are n symmetric sideband signals that need to be exchanged, each processor requires n*2 GPIOs (one GPIO to transmit a given signal and one GPIO to receive that signal). For example, a symmetric IPC interface between a modem processor and an application processor may comprise five signals, which translates to 10 GPIO pins being necessary for the resulting IPC signaling. The need for so many GPIO pins for IPC communication increases manufacturing cost. Moreover, devoting too many GPIOs for IPC limits the GPIO availability for other system-level peripheral interfaces. The problem cannot be solved by moving the IPC communication onto the main data bus between the processors in that certain corner conditions are then violated.

In addition, a number of digital signaling protocols have been developed to support communication between integrated circuits in a system such as a mobile device. These signaling protocols are deemed herein as "digital" in that the transmitting circuit either drives its transmit pin high to a power supply voltage level or grounds the pin to transmit a bit. Examples of such digital signaling protocols include general purpose I/O (GPIO) and universal asynchronous receiver transmitter (UART). For example, a UART transmitter drives a digital signal over a transmit pin that is received on a receive pin at a UART receiver. The UART receiver samples the received signal using an oversampling clock to determine whether the received signal was binary high or low.

To reduce power consumption in these digital signaling protocols, various lossless data compression techniques have been utilized such as run length encoding (RLE). But run length encoding does not guarantee a fixed and predictable throughput enhancement as the degree of compression depends upon the randomness of the data. If the data transmission is completely random, run length encoding offers no benefit. Other more complex schemes offer improved throughput but are not compatible with digital signaling. For example, the use of a quadrature phase shift key (QPSK) scheme has twice the throughput of conventional digital signaling but requires the use of two independent sinusoidal sub-carriers. In contrast, a digital signal protocol is much simpler as the transmitter needs to merely drive its transmit pin to a power supply voltage and/or to ground during a symbol transmission. Similarly, a digital signaling receiver needs to merely determine whether a voltage high or low signal is being received at each sampling of an oversampling clock.

Accordingly, there is a need in the art for a GPIO architecture that can accommodate numerous input/output signals without requiring an excessive number of pins and that uses an improved digital signaling protocol with increased throughput and reduced power consumption.

SUMMARY

A hybrid virtual GPIO architecture is provided for communication between two integrated circuits each having a processor. This architecture is deemed as "hybrid" in that it accommodates both GPIO signals and messaging signals. As discussed earlier, a GPIO signal in a conventional GPIO system is dedicated to a particular pin. The receipt of the GPIO signal on the corresponding GPIO pin identifies the signal to the receiving processor. But a messaging signal as defined herein is a signal received on a dedicated receive pin such as in a serial peripheral interface (SPI) or an inter process communication (IPC) interface. Assorted messaging signals may thus be received on the same dedicated receive pin. To distinguish between messaging signals, it is conventional that the messaging signals include an address header containing an address. The receiving integrated circuit routes the received messaging signal to an appropriate register based upon the address. For example, one type of messaging signal may relate to the identity of an installed card such as a wireless card or a GPS card. Such a messaging signal would then have an address that maps to an appropriate register so that corresponding message content may be registered accordingly. By interpreting the resulting contents of the register, the receiving processor can then interpret the identity of the installed cards. Other types of messaging signals would be routed to the appropriate registers in the receiving integrated circuit in an analogous fashion.

Each integrated circuit also includes a virtual GPIO interface for communicating with the remaining integrated circuit (or circuits) using a transmit set of GPIO signals. The virtual GPIO interface is configured to transmit a portion of the transmit set over GPIO pins to the remote processor in the opposing integrated circuit in a conventional fashion. But the remaining portion of the transmit set are not transmitted on individual GPIO pins. Instead, the remaining portion of the transmit set GPIO signals are serialized by a hybrid virtual GPIO finite state machine (FSM) into at least one frame and transmitted over a dedicated transmit pin. The hybrid virtual GPIO finite state machine is also configured to serialize the messaging signals into the at least one frame or into dedicated frame(s) for the messaging signals.

Each integrated circuit also includes an oversampling clock that is asynchronous with the oversampling clock in the remaining integrated circuit(s). The integrated circuit's hybrid virtual FSM is configured transmit and receive frames of virtual GPIO signals and/or the frames of messaging signals responsive to cycles of its oversampling clock. The transmitting hybrid virtual FSM transmits each bit in a frame to be transmitted over its transmit pin by oversampling the bit using the oversampling clock and transmitting the resulting samples over the transmit pin to a receive pin for hybrid virtual FSM in a remote integrated circuit. The receiving hybrid virtual FSM samples each received bit using its oversampling clock and decodes the bits based upon the resulting samples as known in the UART arts. The resulting architecture is quite advantageous as no external clock pins are necessary to synchronize the resulting transmission of virtual GPIO signals and messaging signals using just a single transmit pin and a single receive pin.

To enhance virtual GPIO transmission, each hybrid virtual GPIO (VGPIO) interface is further configured to transmit and receive the frame bits using phase-encoded pulse-width-modulated symbols. For example, suppose that the symbols have two possible pulse widths. In a conventional pulse-width modulation scheme, these two pulse widths would represent one bit. But in addition, the symbols also have at least two possible phases. In a two-phase embodiment, the pulses are either aligned to have their falling edges aligned with the end of the bit period or to have their rising edges aligned with the beginning of the bit period. The two phase alignments thus represent another bit. Given this combination of both pulse-width modulation and phase modulation, the resulting symbols are denoted herein as "multi-modulation" symbols or words. These words are quite advantage as compared to binary phase or pulse-width modulation schemes due to their increased throughput and reduced power consumption. Moreover these advantages are obtained without departing from traditional digital signaling techniques. The complications involved with analog sinusoids such as in QPSK are thus avoided.

There are two main embodiments for the disclosed hybrid virtual GPIO architecture. In a first embodiment, each frame transmitted over the dedicated transmit pin includes a header that identifies whether the frame comprises a transmit set of virtual GPIO signals or a transmit set of messaging signals. The header may also indicate the frame will identify the virtual GPIO frame length to be set on the receiver side or indicate an acknowledgement of the desired virtual GPIO frame length. The frame size is thus variable and determined by the resulting stream-length-determining frame. In a second embodiment, the header is extended for a frame that includes both virtual GPIO signals and messaging signals such that the extended header identifies the bit positions of the virtual GPIO signals and the messaging signals. The hybrid GPIO interface can then provide a second set of signals to the receiving processor that comprises the second set of GPIO signals and messaging signals from the remote processor.

The hybrid virtual GPIO FSM transits the transmit set of virtual GPIO signals and messaging signals in frames that are each demarcated by a start bit and an end bit. The hybrid virtual GPIO FSM in a receiving device thus receives the transmitted frames as its receive set of virtual GPIO signals and messaging signals. By monitoring whether it receives a complete frame including both the start bit and the end bit, an FSM for one processor can detect whether the remote processor has failed.

These and additional advantages may be better appreciated through the following detailed description.

BRIEF DESCRIPTION OF THE DRAWINGS

FIG. 6A is a block diagram for a hybrid virtual GPIO architecture in which a processor communicates with a single remote processor.

FIG. 6B is a block diagram for a hybrid virtual GPIO architecture in which a processor communicates with two remote processors.

FIG. 12 illustrates a table of codewords for the frame of FIG. 11.

Embodiments of the disclosure and their advantages are best understood by referring to the detailed description that follows. It should be appreciated that like reference numerals are used to identify like elements illustrated in one or more of the figures.

DETAILED DESCRIPTION

A digital signaling protocol is provided that doubles the throughput over the traditional digital signaling used in, for example, the UART signaling protocol. In that regard, a UART bit is typically represented by a binary voltage signal that is either at the power supply voltage level or ground. This is quite advantageous in terms of simplicity as a conventional inverter may be used as the output driver. The digital signaling protocol disclosed herein preserves this simplicity in that each transmitted symbol is a binary combination (a first portion of the symbol being pulsed high to the power supply voltage and a second portion being discharged). To enhance throughput over traditional digital signaling techniques, a transmitter is provided that transmits phase-encoded pulse-width-modulated symbols. The following example embodiment is directed to a system using just two pulse widths and two phases but it will be appreciated that any number of pulse widths and phases may be combined as disclosed herein.

Figure 1:
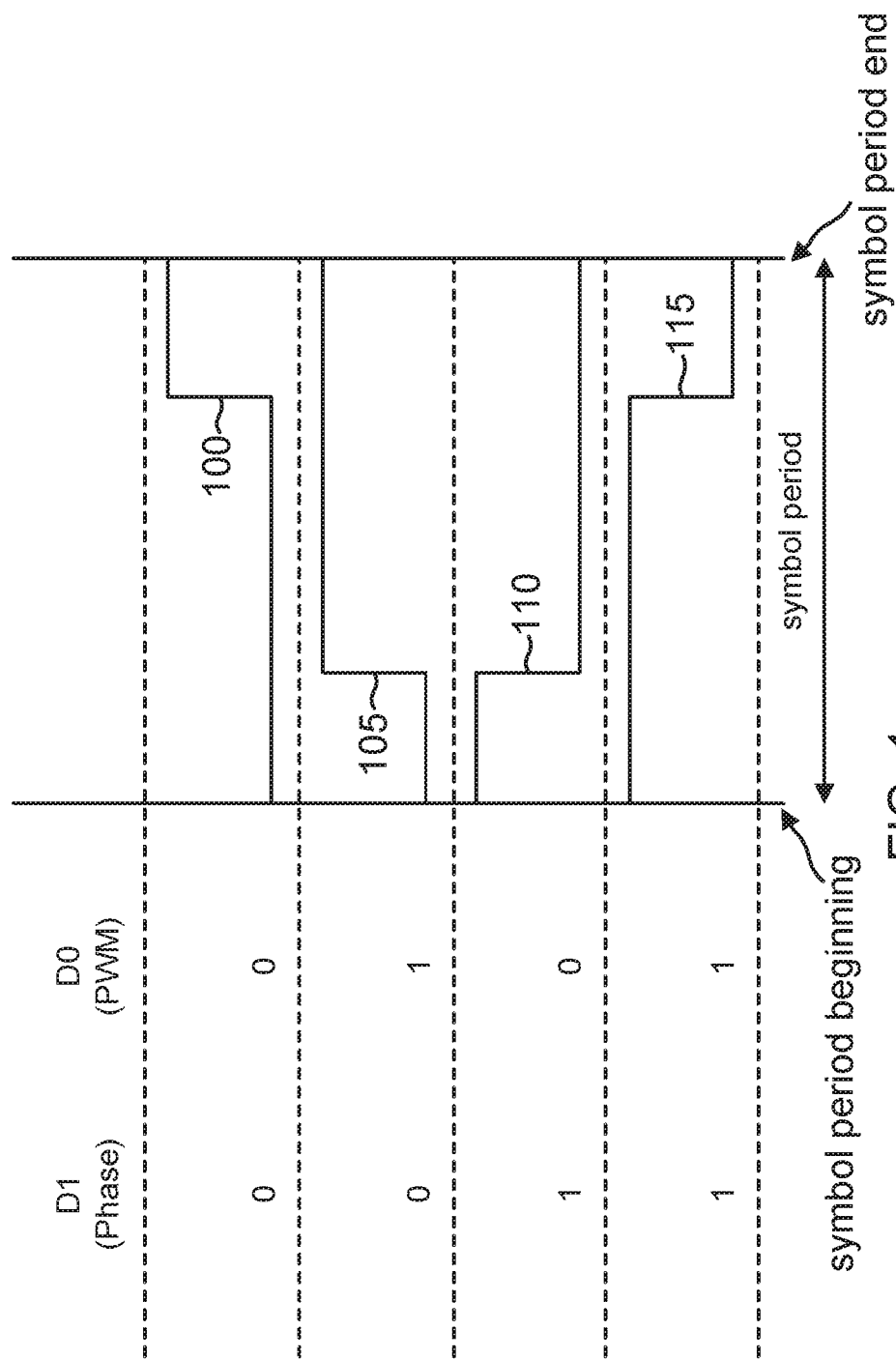
FIG. 1 illustrates four example multi-modulation two-bit words.

Two example pulse widths are shown in FIG. 1. A first pulse 100 has a pulse width 25% of a bit period whereas a remaining pulse 105 has a pulse width of 75% of the bit period. It is arbitrary as to what binary assignment is given to the pulse width for pulse 100 but for illustration purposes the pulse width for pulse 100 is assigned a binary zero value. Similarly, the pulse width for pulse 105 represents a binary one. Note that the falling edges for pulses 100 and 105 are aligned with the end of the bit period. In a logic high system, both pulses 100 and 105 thus start with a logic zero (ground) and end logic high (the power supply voltage). In a logic low system, it is equivalent to indicate that pulses 100 and 105 both start with a logic high value (ground) and end with a logic low value (the power supply voltage). The following discussion is directed to a logic high system without loss of generality. Since both pulses 100 and 105 are phased so as to end simultaneously with the bit period boundary, pulses 100 and 105 may be deemed to represent a first phase. This first phase modulation may be deemed to represent a binary 0. Thus, pulse 100 represents a two-bit symbol 00—one binary zero being from the trailing edge alignment and the other binary zero being from the 25% pulse width. Similarly, pulse 125 represents a two-bit symbol 01 with the binary one stemming from the 75% pulse width.

A complementary second phase (rising edge aligned with the beginning of the bit period) is represented by a pair of pulses 110 and 115. Pulse 110 is analogous to pulse 100 in that it also has a pulse width equaling 25% of the bit period. But unlike pulse 100, pulse 110 is shifted 180 degrees such that its rising edge is aligned with the bit period beginning. Similarly, pulse 115 is shifted 180 degrees with respect to pulse 105.

There is thus a binary phase modulation represented by pulses 110 and 115 as compared to pulses 100 and 105. Similarly, each pair of pulses 100/105 and 110/115 represents a binary pulse width modulation. The combination of pulses 100, 105, 110, and 115 thus represent both a binary phase modulation and a binary pulse width modulation such that each pulse may be deemed to comprise a two-bit symbol. Unlike alternative coding techniques such as QPSK, the modulation for pulses 100, 105, 110, and 115 is entirely digital: a transmitter need only transmit a binary high signal for some duration of the bit period and a binary low signal for the remaining duration of the bit period. Since each pulse represents a two-bit word, there are four possible binary two-bit words that may be represented: [00], [01], [10], and [11]. It is arbitrary what two-bit word is assigned to a given pulse. There would be four such choices—FIG. 1 represents one choice in which pulse 100 represents the word [00], pulse 105 represents the word [01], pulse 110 represents the word [10], and pulse 115 represents the word [11]. It will be appreciated that alternative pulse widths such as 70/30 or 80/20 may be used in a binary pulse width modulation scheme. In addition, the number of pulse widths and phases may be increased from just two in alternative embodiments.

Figure 2:
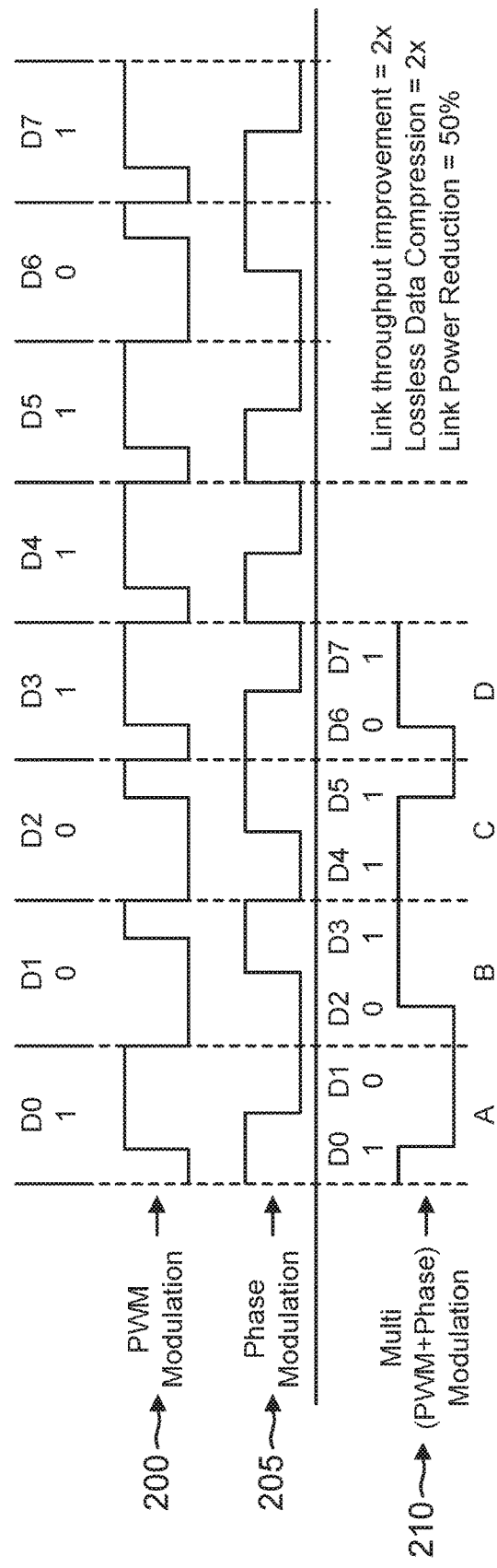
FIG. 2 illustrates the relationship between some of the multi-modulation words of FIG. 1 and a corresponding set of binary-phase-modulated input bits and pulse-width-modulated input bits.

The throughput enhancement and power reduction from the resulting "multi-mode" modulation that combines a binary phase modulation with a binary pulse width modulation may be better appreciated with reference to FIG. 2. There are eight binary bits D0 through D7 that are processed using pulse-width modulation to produce a pulse-width-modulated sequence 200. These same bits may also be processed using phase modulation to produce a phase-modulated sequence 205. The carrier for the phase modulation is a square pulse (a pulse width of 50% of the bit period) that has its falling edge aligned with the end of the bit period to represent a binary zero. Such an alignment will be referred to herein as "not flipped" in that it represents 0 degrees of phase modulation for the square pulse. Conversely, a phase modulation of a binary 1 is represented by a square pulse having its rising edge aligned with the beginning of the bit period. Such a modulation is denoted herein as "flipped" in that it represents one-hundred-and-eighty degrees of phase modulation.

For either sequence 200 and 205, it requires eight bit periods to transmit the eight bits D0 through D7. In contrast, a multi-modulation sequence 210 transmits these eight bits in just four bit periods, which represents a two times greater throughput than the single-modulated sequences 200 and 205. To create multi-modulation sequence 210, half of the bits D0 through D7 are designated as pulse-width modulation bits and a remaining half are designated as phase modulation bits. For example, bits D0, D2, D4, and D6 in sequence 205 may be assumed to represent the phase modulation bits. Conversely, bits D1, D3, D5, and D7 in sequence 200 may be assumed to represent the pulse-width modulation bits. In this example, a binary 1 is represented by a pulse of 75% of the bit period whereas a binary 0 is represented by a pulse of 25% of the bit period. These pulses in sequence 200 all have their falling edges aligned with the end of their respective bit periods.

Each phase modulation bit phase modulates the subsequent pulse-width modulation bit. In this case, a binary one for these phase modulation bits is assumed to represent a 180 phase reversal such that the pulse modulation is "flipped" so as to have a rising edge alignment with the beginning of the symbol period. Conversely, a binary zero for these phase modulation bits is assumed to represent no phase change ("not flipped") so as to have a falling edge alignment with the end of the symbol period. Since the phase modulation bit D0 has a binary one value, the pulse from PWM bit D1 in sequence 200 is flipped to form a corresponding multi-modulation word A (which corresponds to word 110 discussed with regard to FIG. 1) in sequence 210. Conversely, the phase bit D2 has a binary zero value so that the pulse from PWM bit D3 is not flipped to form a corresponding multi-modulation word B (which corresponds to word or symbol 105 of FIG. 1). However, the phase modulation bit D4 has a binary one value so the pulse from PWM bit D5 is flipped to form a corresponding multi-modulation word C (which corresponds to word 115 of FIG. 1). Finally, the phase bit D6 is a binary zero so the pulse from PWM bit D7 is not flipped to form a corresponding multi-modulation word D (which again corresponds to word 105 of FIG. 1). One can immediately see several advantages of the resulting multi-modulation words as compared to the input PMW and phase modulation bits. For example, the throughput is increased by two if one assumes that the multi-modulation period is the same as the bit period for the phase and PWM bits. In addition, since there is just the transmission of four pulses in the multi-modulation words as compared to the use of eight phase bits or eight PWM bits so that power consumption is decreased by one half. Finally, the electromagnetic interference (EMI) from multi-modulation words A through D is reduced as compared to using eight PWM bits since the number of rising and falling edges is reduced by one half.

Figure 3:
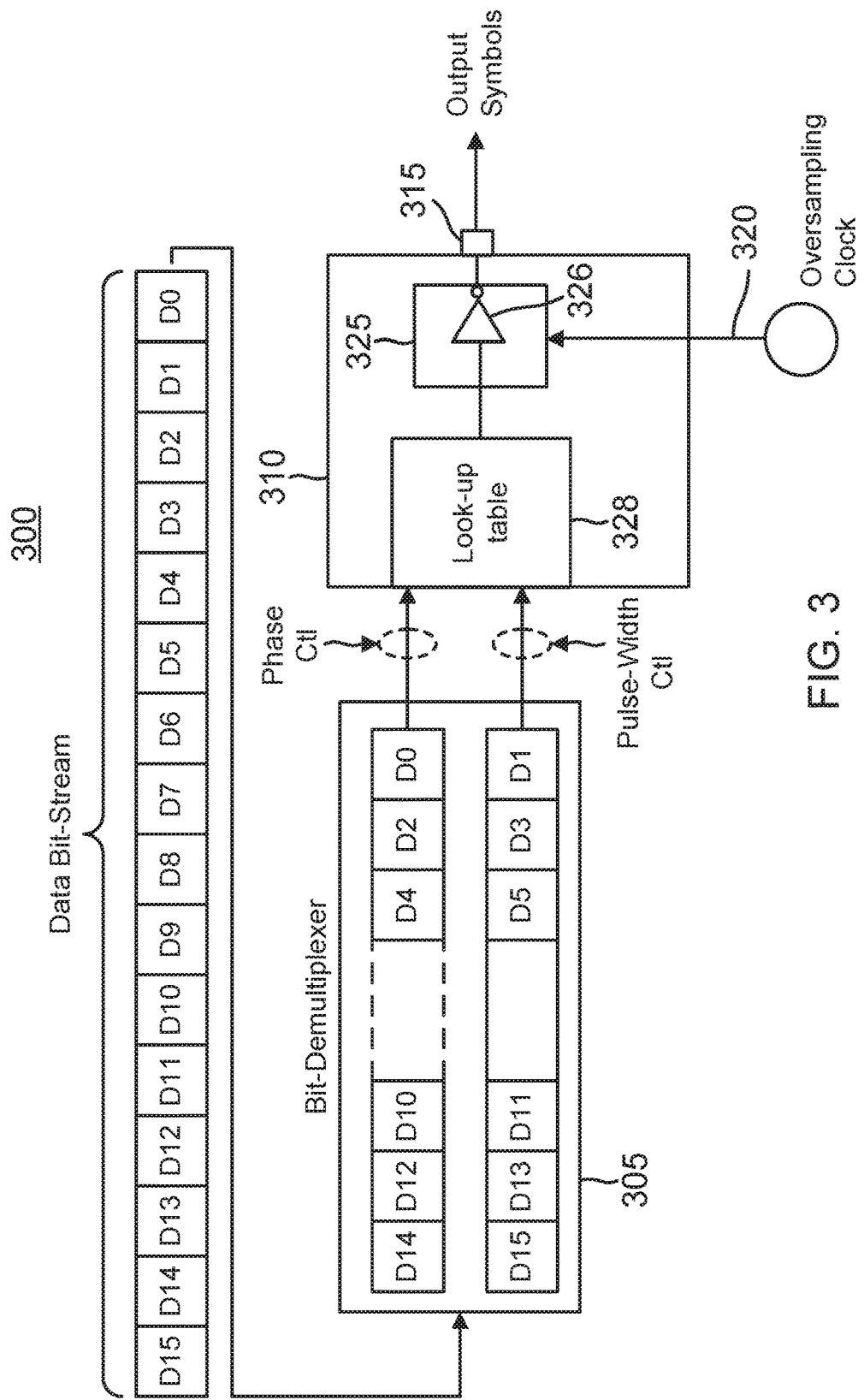
FIG. 3 is a block diagram for a transmitter in accordance with an embodiment of the disclosure.

An example transmitter 300 is shown in FIG. 3 that is configured for transmission of multi-modulated words. A bit de-multiplexer 305 receives an input data stream and de-multiplexes the input bit stream into PWM input bits and phase input bits. For example, if the input bit stream comprises sixteen bits ranging from a bit D0 to a bit D15, de-multiplexer 305 may de-mux bits D0, D2, D4, D6, D8, D10, D12, and D14 to form the phase bits. Conversely bits D1, D3, D5, D7, D9, D11, D13, and D15 form the PWM bits. In this embodiment, each phase bit and the consecutive PWM bit form an input bit pair that is modulated by as modulator 310 into one of the four possible output words 100, 105, 110, and 115 of FIG. 1. For example, bits D0 and D1 form one input bit pair, bits D2 and D3 form another, and so on. Modulator 310 may comprise a four-bit look-up table 328 corresponding to the four possible input combinations [00], [01], [10], and [11]. Look-up table 328 selects for pulse 100 when an input bit pair [00] is received. Similarly, look-up table 328 selects for pulse 105 when an input bit pair [01] is received and so on. To provide additional increases in throughput, the input data stream may losslessly encoded such as by being run length encoded prior to the bit-demuxing. An output driver 325 may include an inverter 326 that drives out on an output pin 315 inverted forms of the symbols retrieved by look-up table 328. The timing of the resulting symbol periods may occur responsive to a clock signal such as an oversampling clock signal 320 from an oversampling clock.

Figure 4:
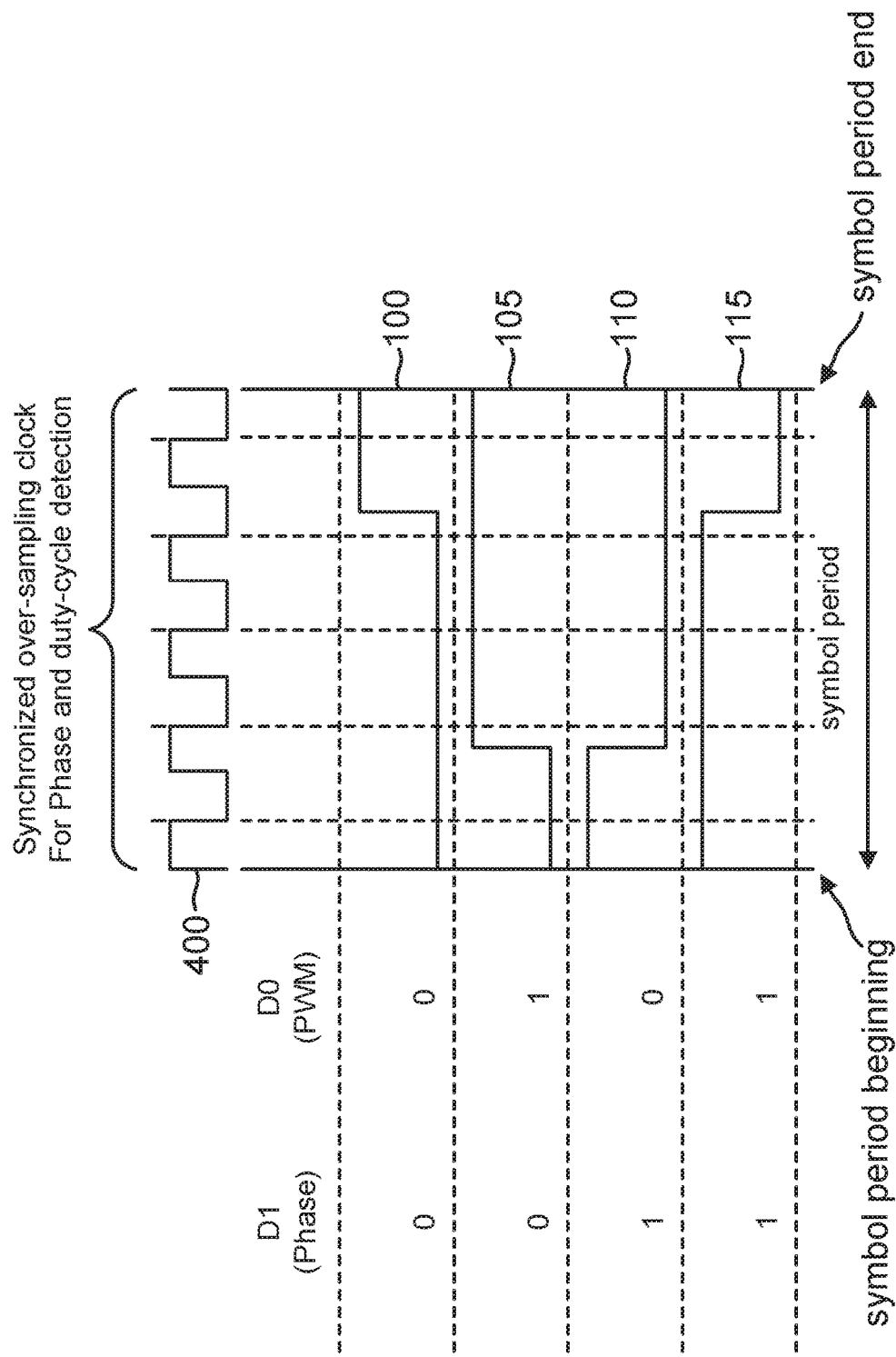
FIG. 4 illustrates the oversampling clock samples for demodulating the multi-modulated words transmitted from the transmitter of FIG. 3.

The demodulation of the multi-modulation words in a receiver may be performed with regard to an oversampling clock signal 400 such as illustrated in FIG. 4. In that regard, both the transmitter and receiver may include an analogous oversampling clock. To keep the oversampling clocks in phase with each other, the transmitter may periodically transmit a training sequence that such as a series of pulses having a 50% duty cycle. The multi-modulation words may then be transmitted using frames and headers such as is conventionally performed in UART. The frame and header dimensions are known to both the receiver and transmitter. Thus, the receiver may determine the bit boundaries for the frames with regard to this known structure. As shown in FIG. 4, the receiver may use the initial sample of each word 100 through 115 to determine its phase. If that first sample is zero, then the receiver knows that it will be demodulating either word 100 or 105. To distinguish between these words, the receiver may count the number of samples that are binary one (the power supply voltage) as compared to the number that are binary zero to determine the pulse widths. On the other hand, if the initial sample is binary one, the receiver must then distinguish between words 110 and 115. This distinction may also be performed by determining the number of oversampling samples that are binary one as compared to binary zero. Such an oversampling scheme may be readily extended to demodulate higher order (greater than binary) phase and pulse-width modulations. In addition, the multi-modulation may also employ multiple amplitudes to allow yet a greater reduction of power consumption and increase in throughput.

The multi-mode modulation described herein may be advantageously applied in a virtual GPIO architecture. In particular, a hybrid virtual general purpose input/output (GPIO) architecture is provided that enables a system to use a pair of pins as if they constituted a larger plurality of GPIO pins and also a dedicated transmit pin and a dedicated receive pin for messaging signals. As used herein, "messaging signals" refer to signals that would conventionally be transmitted over a dedicated transmit pin such as practiced in the IPC, SPI, or UART protocols. Each messaging signal thus include an address so that the receiving processor may route the received messaging signal to the appropriate register. In the hybrid virtual GPIO architecture, the address signals are replaced by the bit order within a transmitted frame. For example, it may be understood that a first bit in a messaging frame is to be delivered upon receipt to a first messaging register. Similarly, a second bit in a messaging frame is delivered upon receipt to a second messaging register, and so on. Each messaging register has an address such that the receiving processor knows the identify of a messaging signal through the address of the corresponding messaging register from which the processor retrieves the messaging signal.

The hybrid virtual GPIO architecture is deemed as "virtual" in that, to the system-level applications creating the virtual GPIO signals, it is as if those virtual GPIO signals were being accommodated for input/output on conventional GPIO pins. In other words, a system on chip (SoC) or processor having the virtual GPIO architecture disclosed herein experiences no functional difference between GPIO signals and virtual GPIO signals. However, only two pins are used to transmit and receive the virtual GPIO signals that would otherwise each need their own dedicated pair of GPIO pins (if the GPIO signal is symmetric). The hybrid virtual GPIO architecture is deemed as "hybrid" in that dedicated transmit pin that is used to transmit the virtual GPIO signals is also used to transmit the messaging signals to a remote processor. Similarly, the dedicated receive pin that is used to receive the virtual GPIO signals is also used to receive the messaging signals from the remote processor.

The virtual GPIO signals disclosed herein will be discussed with regard to accommodating IPC between an applications processor and a modem processor in a mobile telephone or other communication device. However, it will be appreciated that the virtual GPIO circuits and techniques disclosed herein are widely applicable to system on chip (SoC) or application specific integrated circuits (ASICs) requiring GPIO capabilities.

The disclosed hybrid virtual GPIO architecture makes the health of the transmitting node transparent to the receiving node. This is an important advantage, particularly during the debugging stage for software implementation as it indicates to the receiving processor the time that a transmitting processor became inoperative. To enable such a robust virtual GPIO capability, each integrated circuit includes a dedicated transmit pin coupled to transmit line on the circuit board and a dedicated receive pin coupled to a receive line of the circuit board. In that regard, the virtual GPIO signals may be divided into a transmit set for transmission over the transmit line and a receive set for reception on the receive line. If the signaling is symmetric, the number of signals in the transmit set for each processor is the same. However, the hybrid virtual GPIO architecture disclosed herein can accommodate asymmetric signaling in which the transmit set of virtual GPIO signals for one processor is not the same size as the transmit set for a remote processor. Analogous to the virtual GPIO signals, the messaging signals are also transmitted over the dedicated transmit pin and received on the dedicated receive pin.

Figure 5:
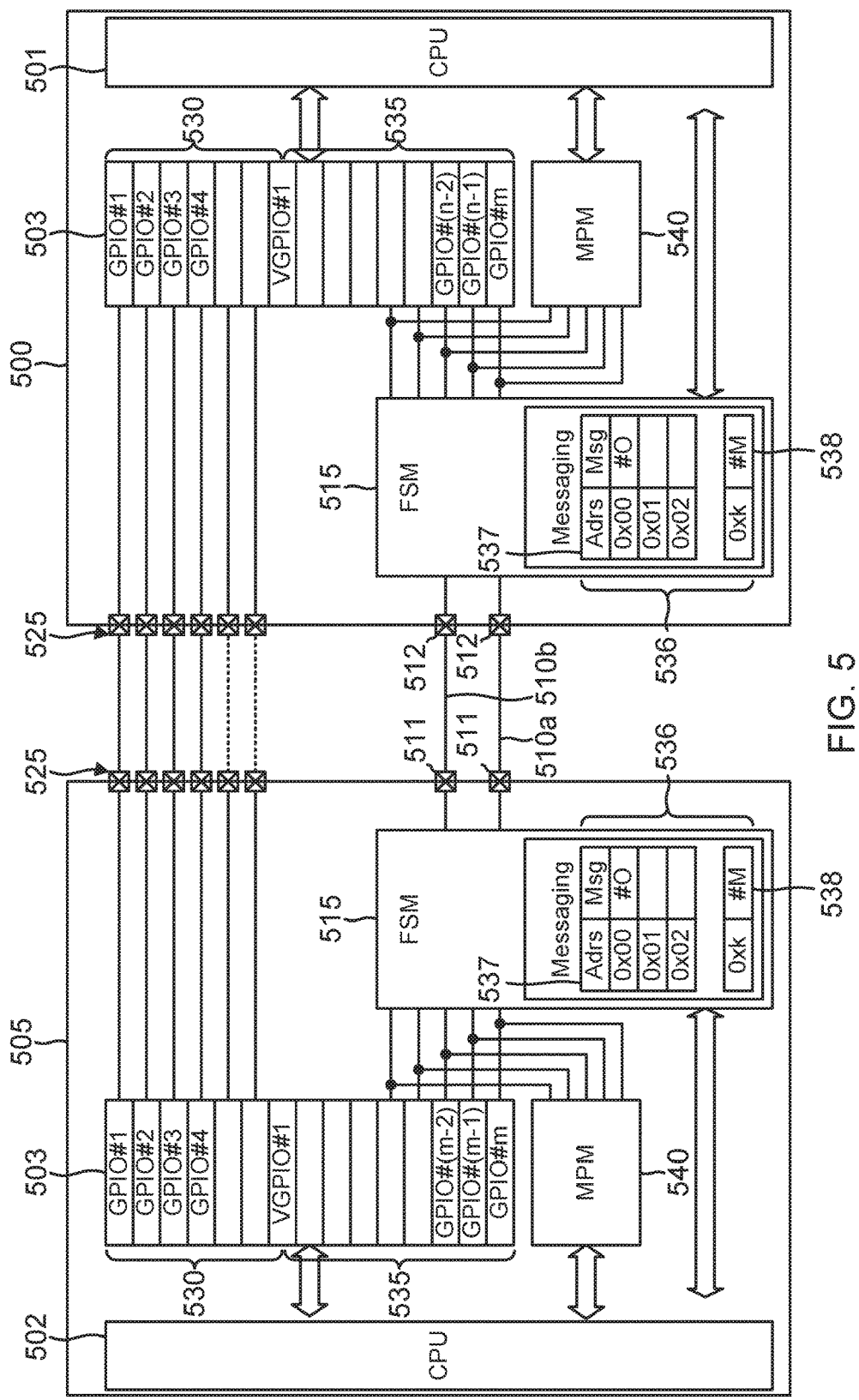
FIG. 5 is block diagram of an example hybrid virtual GPIO architecture.

A hybrid virtual GPIO architecture is shown in FIG. 5 that includes an application processor integrated circuit 505 and a modem processor integrated circuit 500 within a mobile telephone or other communication device. A transmit line 510*a* for application processor integrated circuit 505 is a receive line for modem processor integrated circuit 500. Similarly, a transmit line 110*b* for modem processor integrated circuit 500 is the receive line for application processor integrated circuit 505. These lines or leads are carried on a circuit board or other physical interconnect between the integrated circuits 500 and 505. Each integrated circuit includes a dedicated transmit pin 512 to couple to the corresponding transmit line (e.g., line 510*b* for modem processor integrated circuit 500). Similarly, each integrated circuit includes a dedicated receive pin 511 to couple to the corresponding receive line (e.g., line 510*a* for modem processor integrated circuit 500). A hybrid virtual finite state machine (FSM) 515 in each integrated circuit controls the transmission and reception using these dedicated lines and pins with regard to cycles of an oversampling clock signal 320 (FIG. 3) as discussed further herein.

Application processor integrated circuit 505 includes a processor 502. Similarly, mode processor integrated circuit 500 includes a processor 501. Each processor transmits and receives GPIO signals through a GPIO interface 503 with which it interfaces with GPIO pins 525 in a conventional fashion. A certain portion of the signals processed through each hybrid virtual GPIO interface 503 may be transmitted and received on conventional GPIO pins 525 as conventional GPIO signals 530. But a remaining portion of the signals processed through GPIO interface 503 are not transmitted or received through conventional GPIO pins 525. Instead, some of this remaining signal portion comprises a plurality of virtual GPIO signals 535 that are transmitted and received through the corresponding hybrid virtual FSM 515 using a dedicated transmit pin and a dedicated receive pin. Each hybrid virtual FSM 515 also interfaces directly with the corresponding processor with regard to receiving and transmitting messaging signals 538. Since messaging signals 538 are not GPIO signals, they do not couple through GPIO interfaces 103. Each FSM 115 transmits and receives messaging signals 538 through its dedicated transmit pin 512 and receive pin 511. These pins are thus "hybrid" pins in that they are used for both virtual GPIO signals 535 and messaging signals 538.

Virtual GPIO signals 535 do not each have their own dedicated pins as is the case for conventional GPIO signals 530. This is quite advantageous in that the resulting hybrid virtual GPIO architecture achieves a significant reduction of pins as compared to a conventional GPIO embodiment in which virtual GPIO signals 535 would each require their own pin. Messaging signals 538 would conventionally require another dedicated transmit pin and another dedicated receive pin as well. But these additional pins are also eliminated in the advantageous hybrid virtual GPIO architecture of the present matter.

An integrated circuit may include just one hybrid virtual FSM 515 or may include a plurality of these elements for interfacing with multiple external systems. FIG. 6A illustrates a hybrid virtual GPIO architecture in which an integrated circuit 600 includes a single hybrid virtual FSM 515 for communicating with a remote processor in an integrated circuit 605, which includes its own single hybrid virtual FSM 515. In contrast, an integrated circuit 620 shown in FIG. 6B includes a first hybrid virtual FSM 115A and a second hybrid virtual FSM 115B for communicating with remote processors in integrated circuits 625 and 630, respectively. In that regard, an integrated circuit as discussed herein may be configured with as many hybrid virtual FSMs 515 as is necessary to accommodate hybrid virtual GPIO signaling with other devices.

Referring again to FIG. 5, because virtual GPIO signals 535 are accommodated using a finite state machine such as hybrid virtual FSM 515, processors 501 and 502 may be asleep or in another type of dormant state yet be able to receive virtual GPIO signals 535 and messaging signals 538. In this fashion, a virtual GPIO architecture not only advantageously economizes the number of pins for each GPIO interface 503 but is also low power.

As used herein, "pin" is a generic term to cover the structure such as a pad or an actual pin that an integrated circuit uses to couple to leads on circuit board or other physical interconnect (e.g., package interconnect or through-hole via interconnect). For example, if each integrated circuit has sixteen GPIO pins or pads 525 as shown in FIG. 5, then these pins could be configured to accommodate eight symmetric GPIO signals 530 (for illustration clarity, only four conventional GPIO signals #1 through #4 are numbered in FIG. 5) or sixteen asymmetric GPIO signals 530. In addition, each integrated circuit can accommodate the input/output interfacing of a plurality of m virtual GPIO signals 535 using lines 510a and 510b, wherein m is an arbitrary plural integer. Similarly, each integrated circuit can accommodate the input/output interfacing of a plurality of M messaging signals 538 using lines 510a and 510b, M being a positive plural integer. With regard to each processor core, there is no difference between GPIO signals 530 and virtual GPIO signals 535: they are both simply signals that are transmitted and received as necessary through GPIO interface 503. However, since virtual GPIO signals 535 and messaging signals 538 do not have dedicated pins in contrast to conventional GPIO signals 530, virtual GPIO signals 535 and messaging signals 538 are serialized in hybrid virtual FSMs 515 for transmission on lines 510a and 510b. Upon reception, each hybrid virtual FSM 515 deserializes the received serialized virtual GPIO signals and the received serialized messaging signals. Thus, each hybrid virtual FSM 515 functions as a serializer/deserializer with regard to virtual GPIO signals 535 and messaging signals 538.

A processor may need to receive an interrupt signal in response to changes in selected ones of the GPIO signals or the messaging signals. With respect to virtual GPIO signals 535 and messaging signals 336, a modem power manager (MPM) 540 monitors the selected GPIO signals or messaging signals as programmed through interrupt configuration registers (not illustrated). Each virtual GPIO signal 535 has a corresponding interrupt configuration register. Should a virtual GPIO signal 535 be required to generate an interrupt in response to that signal changing state, the corresponding configuration register would be programmed accordingly. Similarly, should a virtual GPIO signal 535 or messaging signal 538 be one that does not generate an interrupt regardless of whether that signal has changed state, the corresponding interrupt configuration register would also be programmed accordingly. MPM 540 may also comprise a finite state machine. Thus, just like hybrid virtual FSM 115, MPM 540 is low power and is active regardless of whether its processor is in a sleep mode or some other dormant state.

Virtual GPIO signals 535 may be subdivided into a transmit set and a receive set. In a symmetric system, each transmit set would have the same number. Similarly, each receive set would have the same number of signals. However, it will be appreciated that the disclosed virtual GPIO architecture is advantageous in that it can readily accommodate an asymmetric signaling embodiment in which the transmit sets of virtual GPIO signals 535 and messaging signals 538 have different sizes and in which the receive sets of GPIO signals 535 and messaging signals 538 also have different sizes. Regardless of whether the architecture is symmetric or asymmetric, each hybrid virtual FSM 515 receives the transmit set of virtual GPIO signals 535 in parallel from GPIO interface 503 in the sense that each signal in these transmit sets is carried on its own lead between GPIO interface 503 and hybrid virtual FSM 515. Messaging signals 538 are not GPIO signals and thus do not couple through GPIO interface 503. Instead, each processor 501 and 502 retrieves or writes messaging signals 538 to corresponding ones of messaging registers 536. With respect to a received frame of messaging signals 538, the corresponding hybrid virtual FSM uses the bit order in the frame to identify which messaging signal 538 is written to a particular messaging registers. These messaging registers 536 are each mapped to some offset of a general address for hybrid virtual FSM 515 within the address space for the corresponding processor 501 or 502. Each messaging register 536 thus has its own address 537. In response to an interrupt from MPM 540, processor 101 or 102 can then access messaging registers 536 to obtain the appropriate messaging signals 538. Just like virtual GPIO signals 535, messaging signals 538 may be subdivided into a transmission set and a receive set. Regardless of whether the architecture is symmetric or asymmetric, the resulting transmission of these transmit sets by hybrid virtual FSM 115 takes place over a single transmit pin 512. The transmit set of virtual GPIO signals 535 from one processor becomes the receive set of virtual GPIO signals 535 for the remote processor. Similarly, the transmit set of messaging signals 538 becomes the receive set of messaging signals 538 for the remote processor. The remote processor's hybrid virtual FSM 515 then deserializes the receive set of virtual GPIO signals 535 so that they may be presented in parallel to GPIO interface 503.

Each hybrid virtual FSM 515 includes configuration registers (not illustrated) that store the previous state for the transmit set of virtual GPIO signals 535 and for messaging signals 538. In this fashion, each hybrid virtual FSM 515 can monitor the present state of the transmit set of virtual GPIO signals 535 as received from GPIO interface 503 and only trigger a serial transmission of the corresponding transmit set if the present state has changed with regard to the previous state. In other words, hybrid virtual FSM 515 will trigger a serial transmission of a transmit set of messaging signals 538 or virtual GPIO signals 535 only if one or more of the signals within the transmit set has changed state as detected through the storage of the previous state in the configuration registers. Each processor knows the addresses 537 for messaging signal registers 536 and can thus write into them the desired transmit set and also read any changes in the receive set. Hybrid virtual FSM 515 monitors whether the transmit set of messaging signals 536 has changed with respect to their previous transmission and will trigger a transmission of the transmit set to the remote processor accordingly. MSM 540 monitors whether the receive sets have changed as discussed previously and interrupts the corresponding processor so that the changed receive set may be processed.

Figure 7:
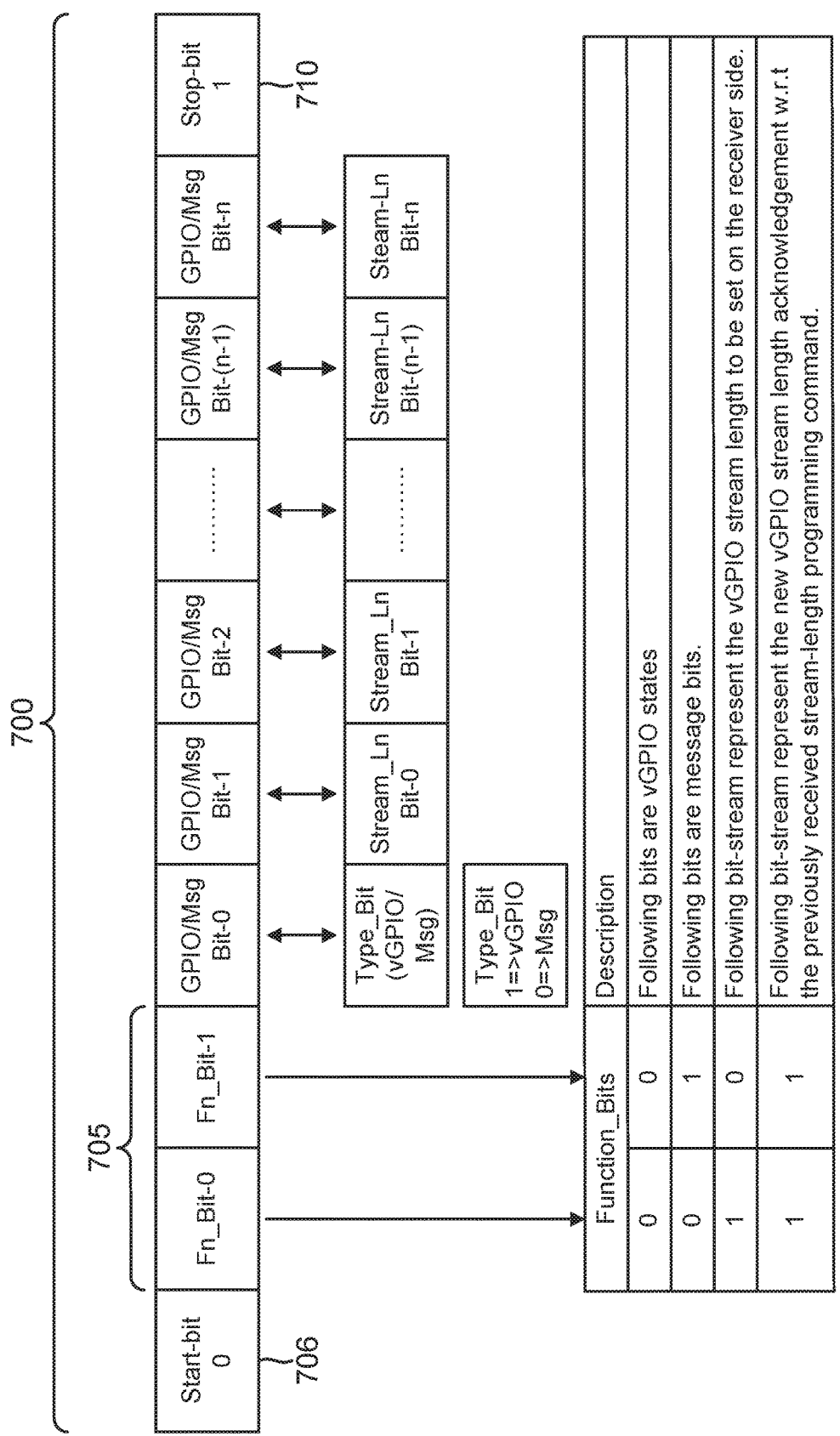
FIG. 7 illustrates an example hybrid frame with a two-bit function header.

The transmitted and received frames have a predefined size. This predefinition of the frame size is necessary in that hybrid virtual FSM 515 identifies the received virtual GPIO signals 535 and received messaging signals 538 by their order within a frame. Should a transmitting processor need to transmit more virtual GPIO signals 535 or messaging signals 538 than can be contained in the default frame size, the transmitting hybrid virtual FSM 515 may signal to the receiving hybrid virtual FSM 515 to change its frame size from the default length to a new programmed length. For example, the frame size may be programmed by a header to be a certain number of bits long. An example frame 700 is shown in FIG. 7. A header 705 may comprise two function bits, fn_0 and fn_1. In one embodiment, if both function bits are zero, the following bits are virtual GPIO signals 535. If fn_0 is zero and fn_1 equals 1, then the following bits are messaging signals 538. If fn_0 is one and fn_1 equals 0, then the following bits in the frame payload represent the new virtual GPIO (or messaging signal) frame length to be expected by the receiving hybrid virtual FSM 515. Similarly, if both function bits are one, the following bits represent an acknowledgement by the remote processor of the desired frame length. If the transmit set of virtual GPIO signals 535 (or the transmit set of messaging signals 538) is less than this fixed frame size, the unused bits within each frame may be don't care values. Alternatively, each hybrid virtual FSM 515 may be configured to alter the size of the transmitted frames depending upon the number of bits needed for a given application. It will be appreciated that the preceding discussion of coding using two function bits is merely an example and that other headers and coding protocols may be used to identify whether a frame is carrying virtual GPIO signals 535, messaging signals 538, an identification of the virtual GPIO frame length, an acknowledgment of the virtual GPIO frame length, an identification of the messaging signal frame length, or an acknowledgment of the messaging signal frame length. In one embodiment, frame 700 may also include a type bit (type_bit) that is identifies whether the frame payload comprises virtual GPIO signals 535 or messaging signals 538.

To detect the receipt of a complete frame for the receive set of virtual GPIO signals 535 or messaging signals 538, hybrid virtual FSM 515 may include a logic circuit (not illustrated) that counts the necessary number of cycles for oversampling clock 320 (FIG. 3) after a receipt of a start bit 706 for frame 700. For example, suppose the receive set comprises ten virtual GPIO signals 535 that are received responsive to 100 cycles of oversampling clock 320 (a 10× oversampling rate). After detection of start bit 706 and waiting another 100 cycles of oversampling clock 320, the FSM logic circuit would then expect receipt of an end bit 710.

Referring again to FIG. 7, a transmit set of virtual GPIO signals is thus transmitted in frame 700 that is demarcated by the start bit 706 and end bit 710. Since the transmit set for a transmitting processor becomes the receive set for the remote processor, the receive set is also framed accordingly. This framing is advantageous in that each processor can then monitor the health of the remote processor without needing any additional dedicated pins. For example, each hybrid virtual FSM 515 may be configured to weakly pull its dedicated transmit pin 512 (and hence weakly pull its transmit line 510*a*) to a supply voltage during a default state (no change in the current state versus the previous state for the transmit set of virtual GPIO signals). The start bit would be a logical zero for such an embodiment such that hybrid virtual FSM 515 grounds its transmit line 510*a* for transmission of the start bit 706. In this fashion, each hybrid virtual FSM 515 may readily detect receipt of the start bit 706 by detecting that its receive line 510*b* has been pulled towards ground. In one embodiment, the start bit 706 and stop bit 710 are logical complements of each other. The stop bit 710 would thus be a logic high value if the start bit 706 is a logic zero. The payload of frame 700 may then extend from the type bit to stop bit 710 that demarcates the frame end.

There is the possibility that a processor has failed such that it inappropriately pulls its transmit line 710*a* to ground. The remote hybrid virtual FSM 515 would thus detect this as a start bit 706 and its logic circuit would begin counting toward the end of the frame 700 accordingly. But if end bit 710 is a logic one, then each hybrid virtual FSM 515 charges its transmit line 510*a* to the power supply voltage to signal the end of a frame transmission. If a processor has failed such that the remote hybrid virtual FSM 115 has detected what is deemed to be a start bit 706, the logic circuit will not detect the end bit and will notify its processor of the failure of the remote processor accordingly.

Consider the advantages of the disclosed virtual hybrid GPIO architecture: only two pins are necessary yet any number of virtual GPIO signals 535 and messaging signals 538 can be serialized and deserialized through the hybrid virtual finite state machines 515. The only limit is the timing requirements for the virtual GPIO signals with respect to oversampling clock 320 and any expected amount of clock lag or lead. Moreover, no other pins are necessary to make the health of one processor transparent to the opposing processor. Frame 700 is also quite advantageous in that with just the overhead of as few as two function bits, various messaging signals 538 and virtual GPIO signals 535 may be transmitted over dedicated transmit pin 112.

Each hybrid virtual FSM 115 may be configured as discussed with regard to FIGS. 3 and 4 to transmit and receive frames 700 using multi-mode modulation such as discussed with regard to symbols 100, 105, 110, and 115. Each received symbol may be demodulated by the receiving hybrid virtual FSM 515 by sampling the received symbol using its oversampling clock and comparing the resulting number of binary 1 samples versus binary 0 samples.

Figure 8:
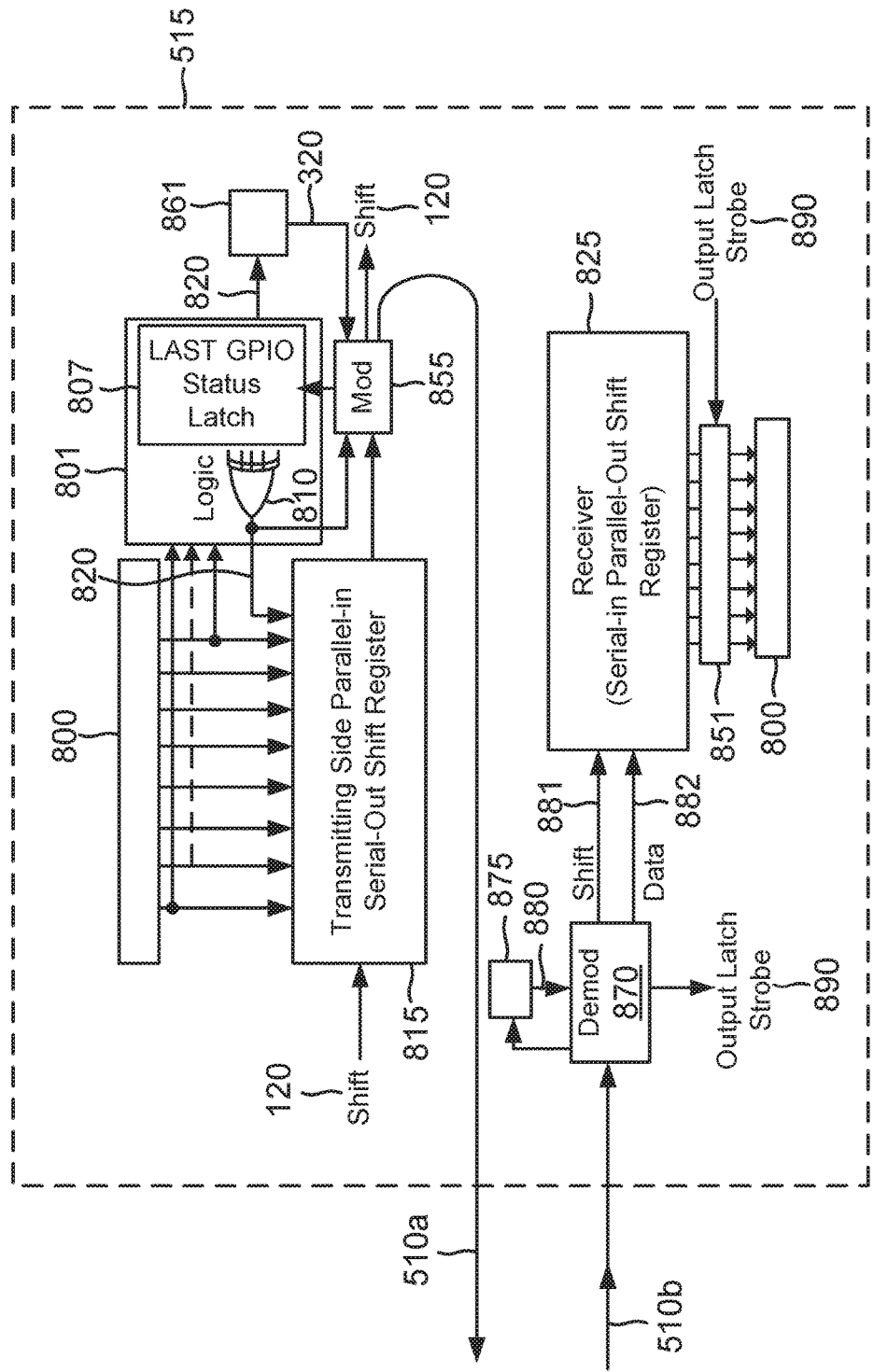
FIG. 8 is a circuit diagram of a hybrid virtual GPIO finite state machine in the hybrid virtual GPIO architecture of FIG. 5.

FIG. 8 is a block diagram of a multi-mode modulation hybrid virtual FSM 515 to better illustrate its transmit and receive operations. FSM 515 receives a transmit set of virtual GPIO signals 535 from its GPIO interface 503 (shown in FIG. 5) through a multiplexing module 800. Alternatively, multiplexing module 800 may receive a transmit set of messaging signals 538 as discussed earlier with regard to FSM 515. FSM 515 includes a logic circuit 801 that will authorize the serial transmission of the transmit set of signals as multi-mode modulated symbols over transmit line 510a if there has been a change in the transmit set as compared to a previous state of the transmit set. In this fashion, there is no unnecessary re-transmission of a transmit set that has not changed state as compared to a previous transmission. Logic circuit 801 thus compares the current transmit set of virtual GPIO signals 535 to the previous transmit set stored in a latch or configuration register 807. To perform the comparison, logic circuit 801 may include an XOR gate 810 that XORs the current transmit set with the previous transmit set stored in configuration registers 807. Multiplexing module 800 loads the current transmit set in parallel into a parallel-in-serial-out (PISO) shift register 815. If an enable signal 820 from XOR gate 810 goes high (indicating a change between the current transmit set and that stored in configuration registers 807), PISO shift register 815 is then enabled to serially shift out its contents onto transmit line 510a responsive to a shift clock 120.

Each transmit set of signals comprises a frame of data that is stored in PISO shift register 815. FSM 515 includes a multi-mode modulator 855 that multi-mode modulates the transmit set of bits shifted out from PISO shift register 815 into multi-mode modulated symbols that are driven to the remote processor on transmit line 510a. This modulation is responsive to counts of oscillation cycles from an oscillator such as the counts of an oversampling clock signal 320 from an oversampling clock source 861. Modulator 855 and oversampling clock source 861 may be triggered by the assertion of enable signal 820 from XOR gate 810. Responsive to this triggering, modulator 855 strobes shift signal 120 so that PISO shift register 815 shifts an initial pair of bits from the transmit set of signals to modulator 855. For example, shift clock 120 may be derived from oversampling clock 320 by decreasing the frequency of oversampling clock 320 by its oversampling rate.

In this fashion, the transmit set of signals for a frame of data stored in PISO shift register 815 are shifted a pair of bits at a time into modulator 855. Depending upon the binary value of for each bit in the pair that is shifted out of PISO shift register 815, multi-mode modulator 855 pulse-width and phase modulates a corresponding symbol transmitted over transmit line 510a. In that regard, each processor may be configured to weakly charge its transmit line 510a high to a power supply voltage VDD during a default state (no data transmission). Referring back to FIG. 3, modulator 855 may comprise modulator 310.

FSM 515 also deserializes a receive set of signals (virtual GPIO signals 535 and/or messaging signals 538) in an analogous fashion using a serial-in-parallel-out (SIPO) shift register 825. A multi-mode demodulator 870 demodulates a received multi-mode modulated symbol from a remote processor as received on receive line 510b. A start bit for each frame is used to synchronize an oversampling clock signal 880 from an oversampling clock 875. Note that in alternative embodiments, clocks 875 and 861 may comprise the same clock. Demodulator 870 may also assert a shift signal 881 to SIPO shift register 825 upon detection from that an entire frame has been received. SIPO shift register 825 would then shift in demodulated data signal 882 from demodulator 870. Once a frame is received, it is latched in a output latch 851 so that the frame may be presented in parallel to multiplexing module 800.

The function bits discussed with regard to FIG. 7 may be enhanced through error-correction coding. Although the error-correction coding increases latency, the function bits are then immune to bit errors that may be corrected through the error-correction coding. The user can then be assured that important function headers such as acknowledgement (ACK) and negative acknowledgement (NACK) will be delivered without errors. The following embodiments will be directed to the use of an Extended Hamming (8,4) code words to define unique functions but it will be appreciated that other error correction techniques may be used.

Figure 9:
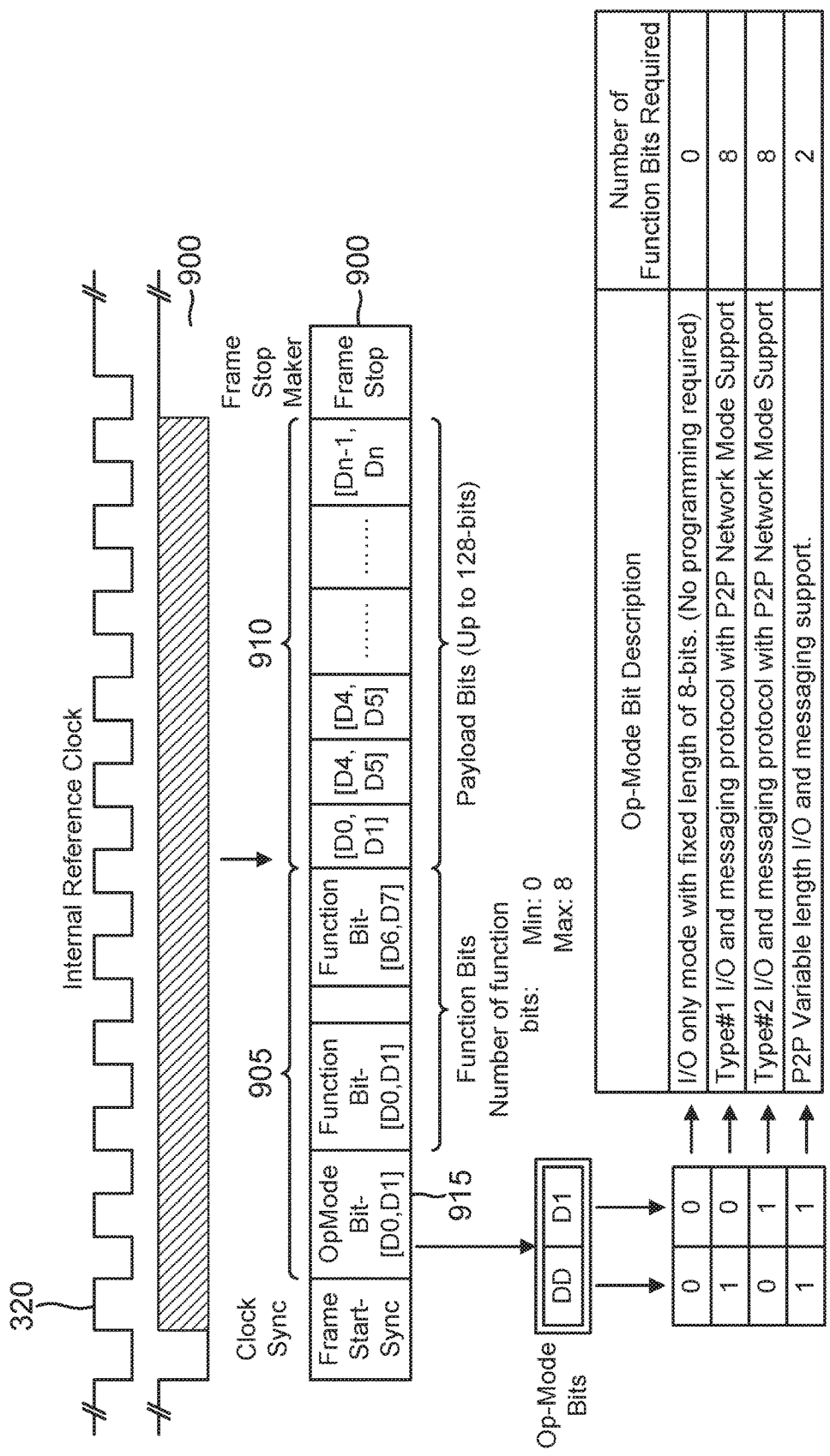
FIG. 9 illustrates a generic frame transmitted by the FSM of FIG. 8.
Figure 10:
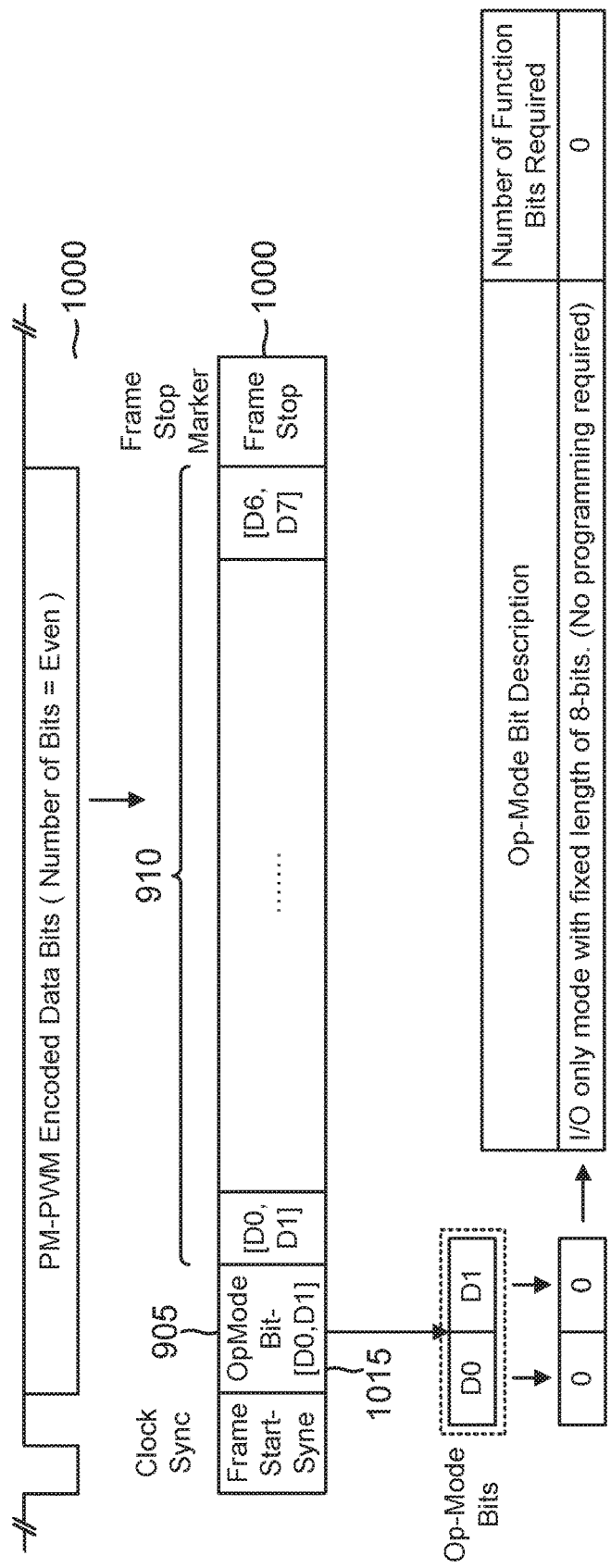
FIG. 10 illustrates a first input/output (I/O) mode for the frame of FIG. 9.

An example frame 900 with error correction is shown in FIG. 9. Analogous to frame 700, frame 900 begins with a start symbol and ends with a logic high (asserted to VDD) stop symbol. A 10-bit long function bit field 905 provides the meta-data associated with a data payload 910 of, for example, up to 128 data bits. These data bits may comprise virtual GPIO signals 530 and/or messaging signals 538 as discussed with regard to FIG. 7. Both function bit field 905 and data payload 910 are transmitted as multi-mode modulated symbols. For example, a first symbol 915 represents both op-mode bits D0 and D1. Since there are two op-mode bits, they encode for four different operational modes. A first mode of operation corresponds to op-mode bits D0 and D1 both equaling zero as shown in FIG. 10 for a frame 1100. In this mode, data payload 910 has a fixed size of eight virtual GPIO bits 535. Given this fixed frame size and relatively brief data payload 1010, function bit field 905 may be shortened in this first mode of operation to just the two op-mode bits D0 and D1.

Figure 11:
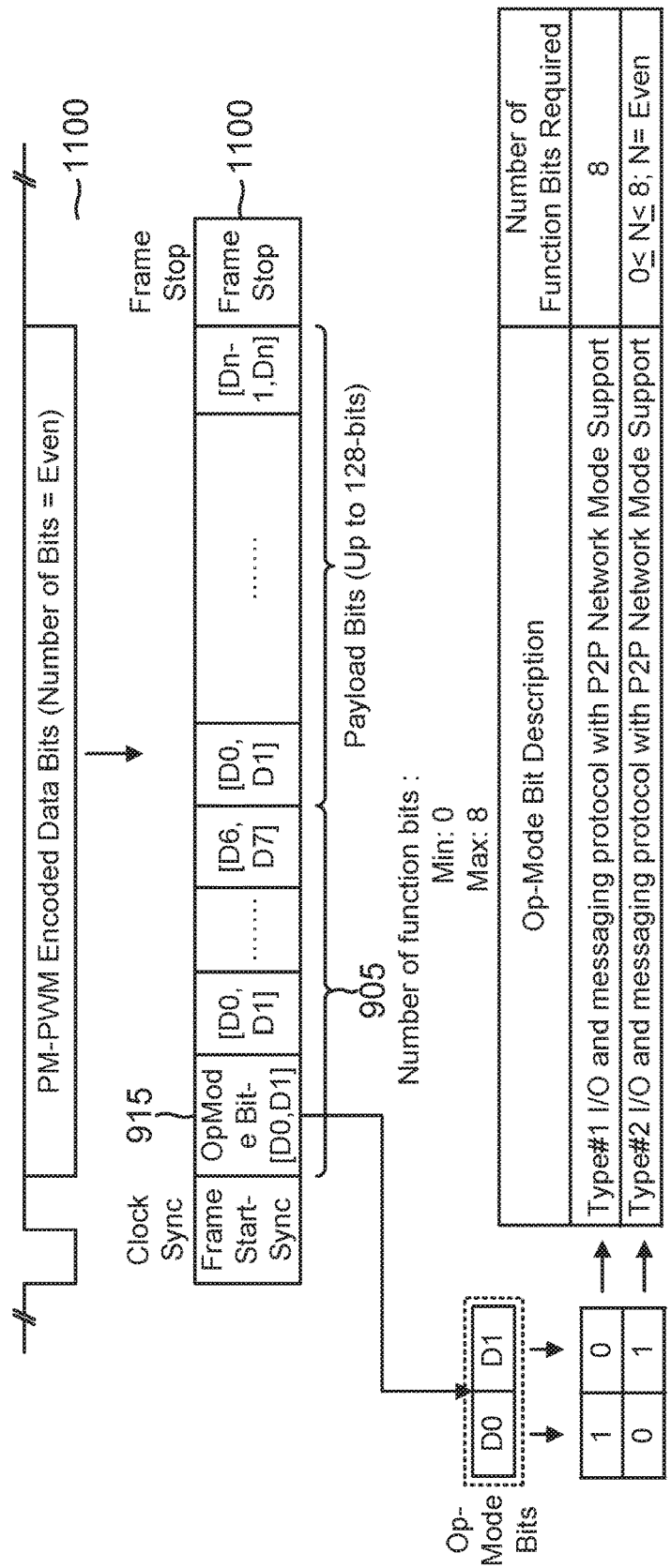
FIG. 11 illustrates a second I/O mode and a third I/O mode for the frame of FIG. 9.

A second and third mode of operation corresponds to frame 1100 shown in FIG. 11. If op-mode bit D0 equals 1 and op-mode bit D1 equals zero, a first P2P (point-to-point) messaging scheme is used. In this first P2P messaging scheme, op-mode bits D0 and D1 are followed by an 8-bit function field. The 8-bit function field may form the Hamming code words shown in FIG. 12. In this fashion, the 8-bit function field is robust to errors such that the receiving hybrid virtual FSM may robustly decode the type of frame being transmitted. Since there are 8 bits, there are 16 Hamming code words that may be transmitted as shown in FIG. 12. In one embodiment, the function header code words may form bit-inverted pairs to advantageously simplify the resulting decoding. For example, code word 6 is an addressed ACK for a point-to-multi-point network whereas bit-inverted code word 9 is an addressed NACK. Similarly, code word 7 is a direct ACK (point-to-point network) whereas bit-inverted code word 8 is a direct NACK. Code word 5 and its bit-inverted corresponding code word 10 may be reserved for future use. Code word 4 designates a flow control override message (FCOM) for an addressed network. Corresponding bit-inverted code word 11 is a flow control override message for a direct network. Code word 3 identifies the associated data payload as being a messaging payload for an addressed network whereas corresponding bit-inverted code word 12 indicates that the associated data payload is a messaging payload for a direct network. Code word 2 indicates that the associated data payload is a virtual GPIO payload for an addressed network whereas bit-inverted code word 13 indicates that the associated data payload is a virtual GPIO payload for a direct network. Code word 1 signifies that the frame is a broadcast frame whereas bit-inverted code word 14 signifies that the frame is a listen-only query. Finally, code word 0 triggers a soft reset whereas corresponding bit-inverted code word 15 triggers a lowest speed mode of operation. It will be appreciated that the assignment of code words in FIG. 12 is merely illustrative of one embodiment and that numerous alternative code word assignments may be utilized.

Referring again to FIG. 11, the third mode of operation corresponds to op-mode bit D0 equaling zero and op-mode bit D1 equaling 1. In this mode of operation, the function-bit field following the op-mode bits may range from 0 to 8 bits. These function bits may be arbitrarily assigned to selected ones of the code words shown in FIG. 12.

Figure 13:
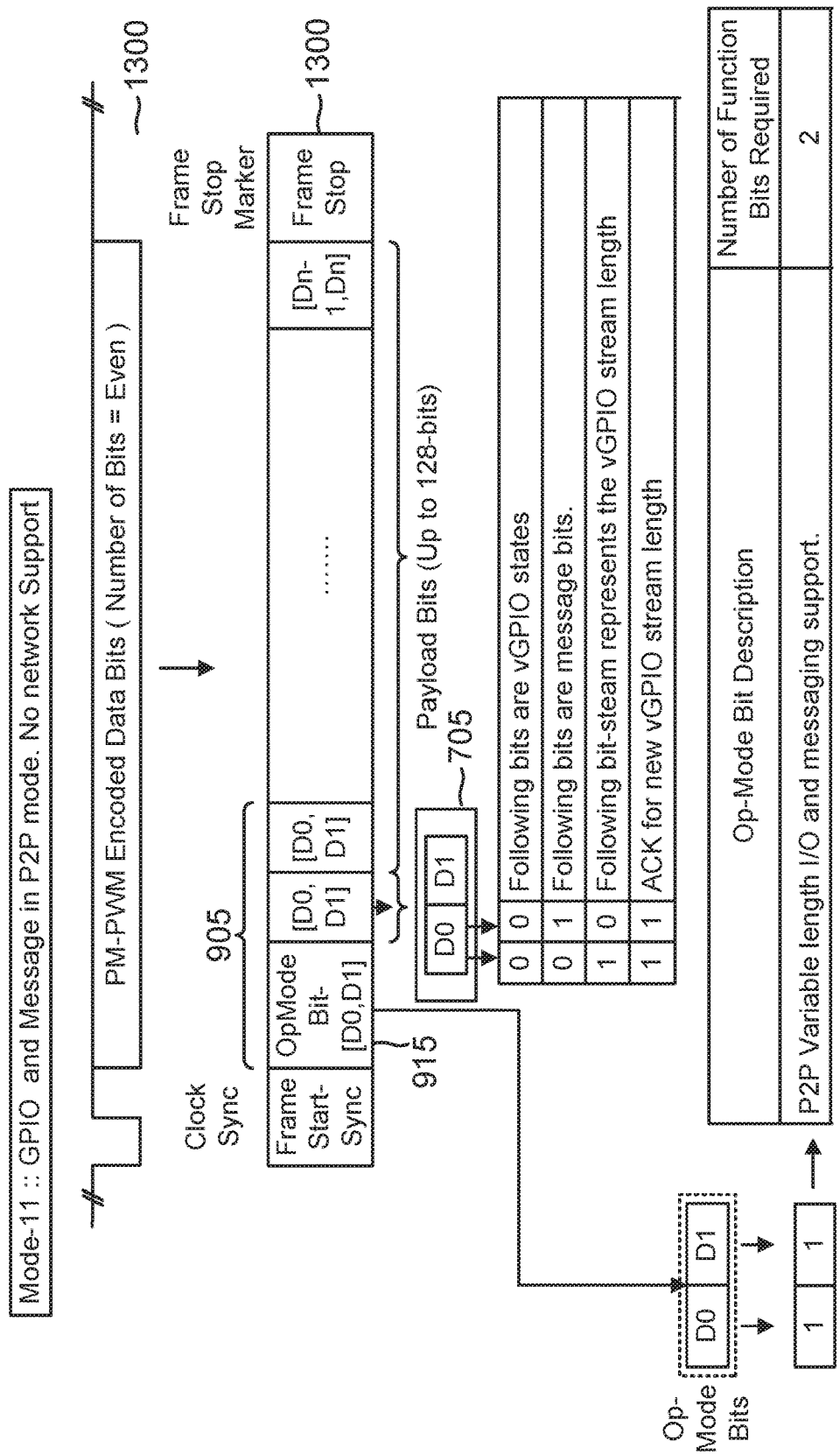
FIG. 13 illustrates a fourth I/O mode for the frame of FIG. 9.

The fourth mode of operation corresponds to a frame 1300 as shown in FIG. 13 in which both op-mode bits D0 and D1 in first symbol 915 equal 1. In this mode, the symbol following the op-mode bits comprises the function bits D0 and D1 705 discussed with regard to FIG. 7. This fourth mode of operation thus supports the programming of a new virtual GPIO stream length to be used for messaging signal and virtual GPIO signal payloads.

Note that the payloads of frames 900, 1000, 1100, and 1300 may all be encoded for error correction as well. In addition, each of these frames begins with a synchronization symbol (clock sync) that that extends over a symbol period. In the first half of the clock synchronization symbol, the transmitting hybrid virtual FSM 515 discharges it transmit pin. In the second half of the synchronization symbol, the transmitting hybrid virtual FSM 515 charges its transmit pin back to the power supply voltage VDD. Since the default state of the transmit pin is high, the receiving hybrid virtual FSM 515 may readily detect the discharge of its receive pin when it receives the first half of the synchronization symbol. The receiving hybrid virtual FSM 515 may also readily detect the rising edge of the synchronization symbol at the midpoint of the symbol transmission. The receiving FSM may thus synchronize its oversampling clock responsive to this rising edge of the synchronization symbol.

Figure 14A:
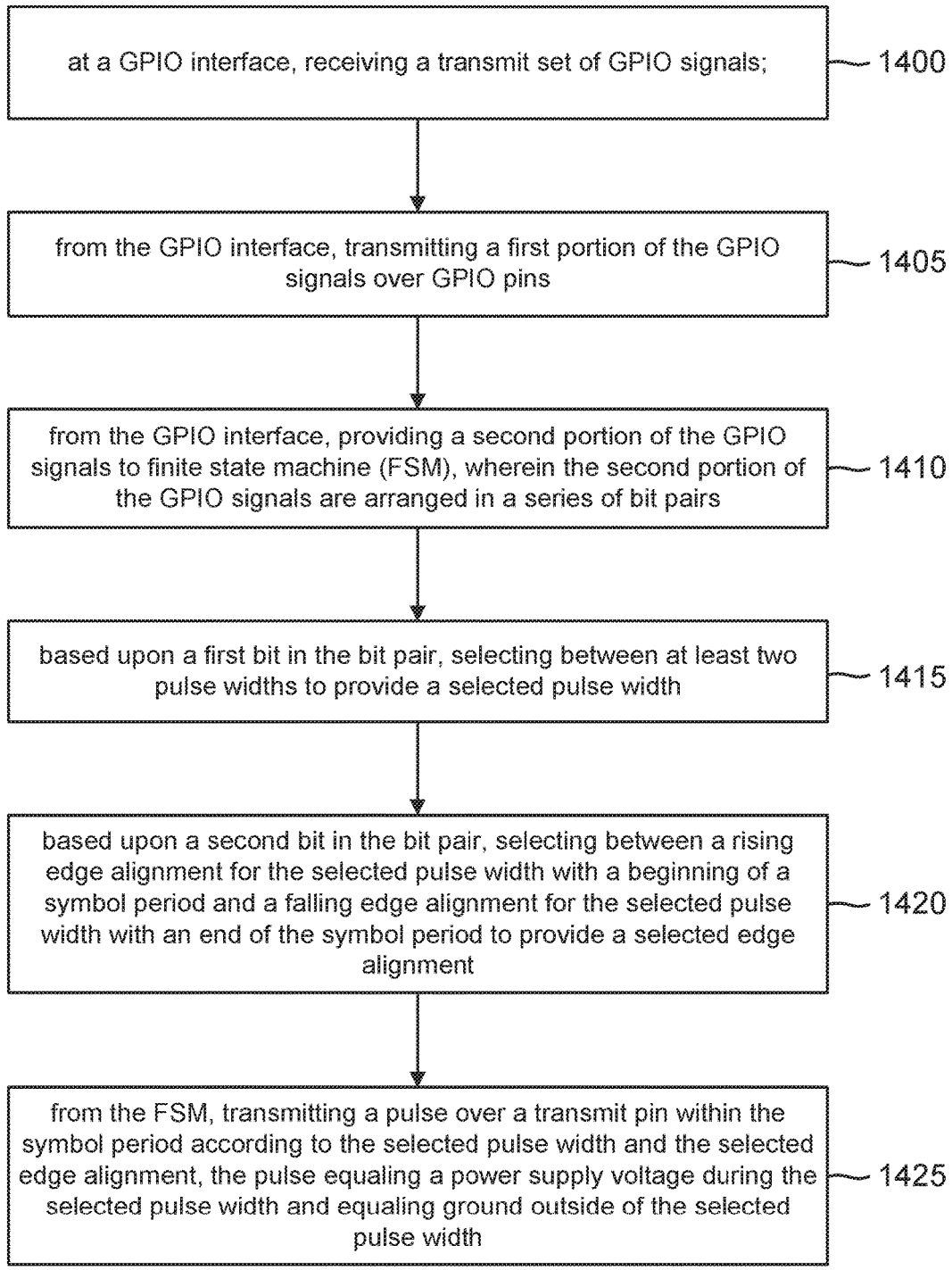
FIG. 14A is a flowchart for a first method of operation in accordance with an aspect of the disclosure.

A first method of operation will now be discussed with regard to the flowchart of FIG. 14A. The first method includes an act 1400 of receiving a transmit set of GPIO signals at a GPIO interface. The receipt of a transmit set of GPIO signals at GPIO interface 503 from a corresponding processor 501 or 502 is an example of act 4100. The method also includes an act 1405 of transmitting a first portion of the GPIO signals over GPIO pins from the GPIO interface. The transmission of GPIO signals 530 over corresponding ones of GPIO pins 525 is an example of act 1405. In addition, the method includes an act 1410 of transmitting from the GPIO interface a second portion of the GPIO signals to a finite state machine (FSM), wherein the second portion of the GPIO signals are arranged in a series of bit pairs. The reception of bit pairs in modulator 855 is an example of act 1410. The following acts are defined with regard to each bit pair. An act 1415 is based upon a first bit in the bit pair and comprises selecting between at least two pulse widths to provide a selected pulse width. The selection of the pulse widths based upon the phase width bit in each bit pair as discussed with regard to look-up table 328 is an example of act 1414. An act 1420 is based upon a second bit in the bit pair and comprises selecting between a rising edge alignment for the selected pulse width with a beginning of a symbol period and a falling edge alignment for the selected pulse width with an end of the symbol period to provide a selected edge alignment. The control of the phase according to the phase-control bit in each bit pair as discussed with regard to look-up table 328 is an example of act 1420. Finally, the method includes an act 1425 of, from the FSM, transmitting a pulse over a transmit pin within the symbol period according to the selected pulse width and the selected edge alignment, the pulse equaling a power supply voltage during the selected pulse width and equaling ground outside of the selected pulse width. The transmission of a pulse-width and phase-width modulated symbol by modulator 855 is an example of act 1425.

Figure 14B:
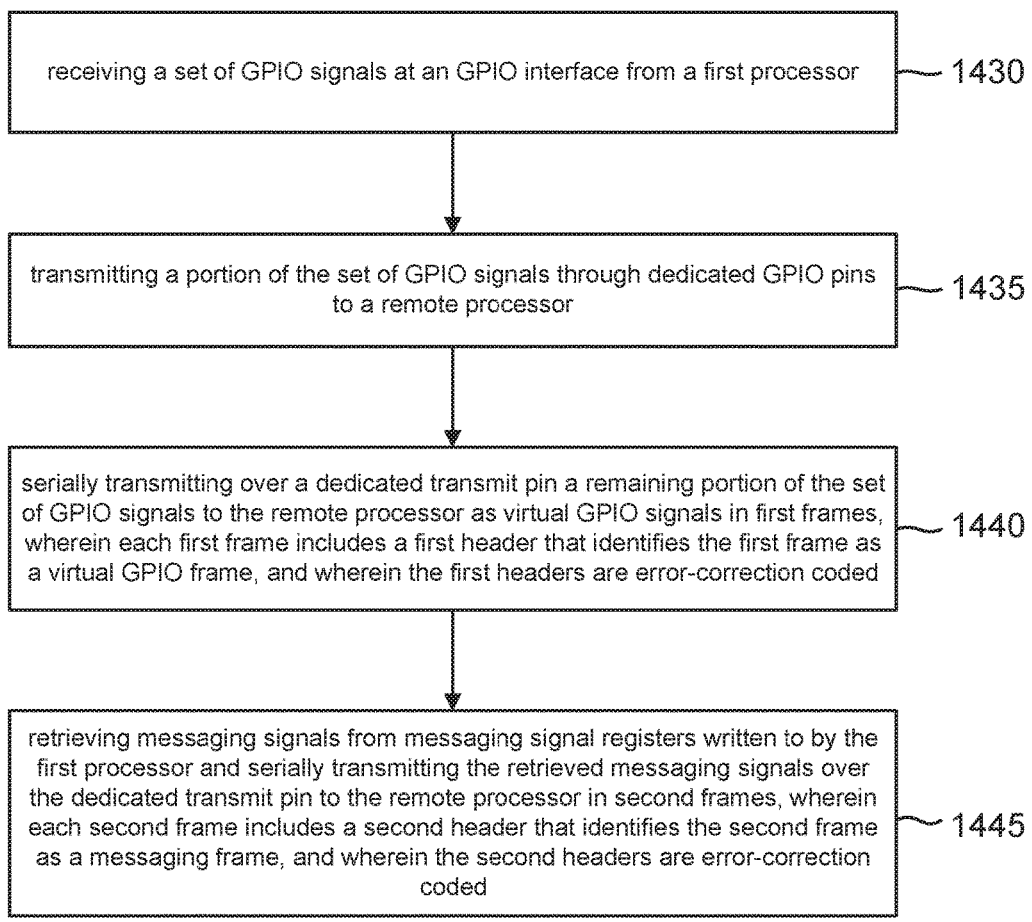
FIG. 14B is a flowchart for a second method of operation in accordance with an aspect of the disclosure.

A second method of operation is discussed with regard to the flowchart of FIG. 14B. Acts 1430 and 1435 are analogous to acts 1400 and 1405, respectively. The method also includes an act 1440 of serially transmitting over a dedicated transmit pin a remaining portion of the set of GPIO signals to the remote processor as virtual GPIO signals in first frames, wherein each first frame includes a first header that identifies the first frame as a virtual GPIO frame, and wherein the first headers are error-correction coded. Finally, the method includes an act 1445 of retrieving messaging signals from messaging signal registers written to by the first processor and serially transmitting the retrieved messaging signals over the dedicated transmit pin to the remote processor in second frames, wherein each second frame includes a second header that identifies the second frame as a messaging frame, and wherein the second headers are error-correction coded.

Figure 15:
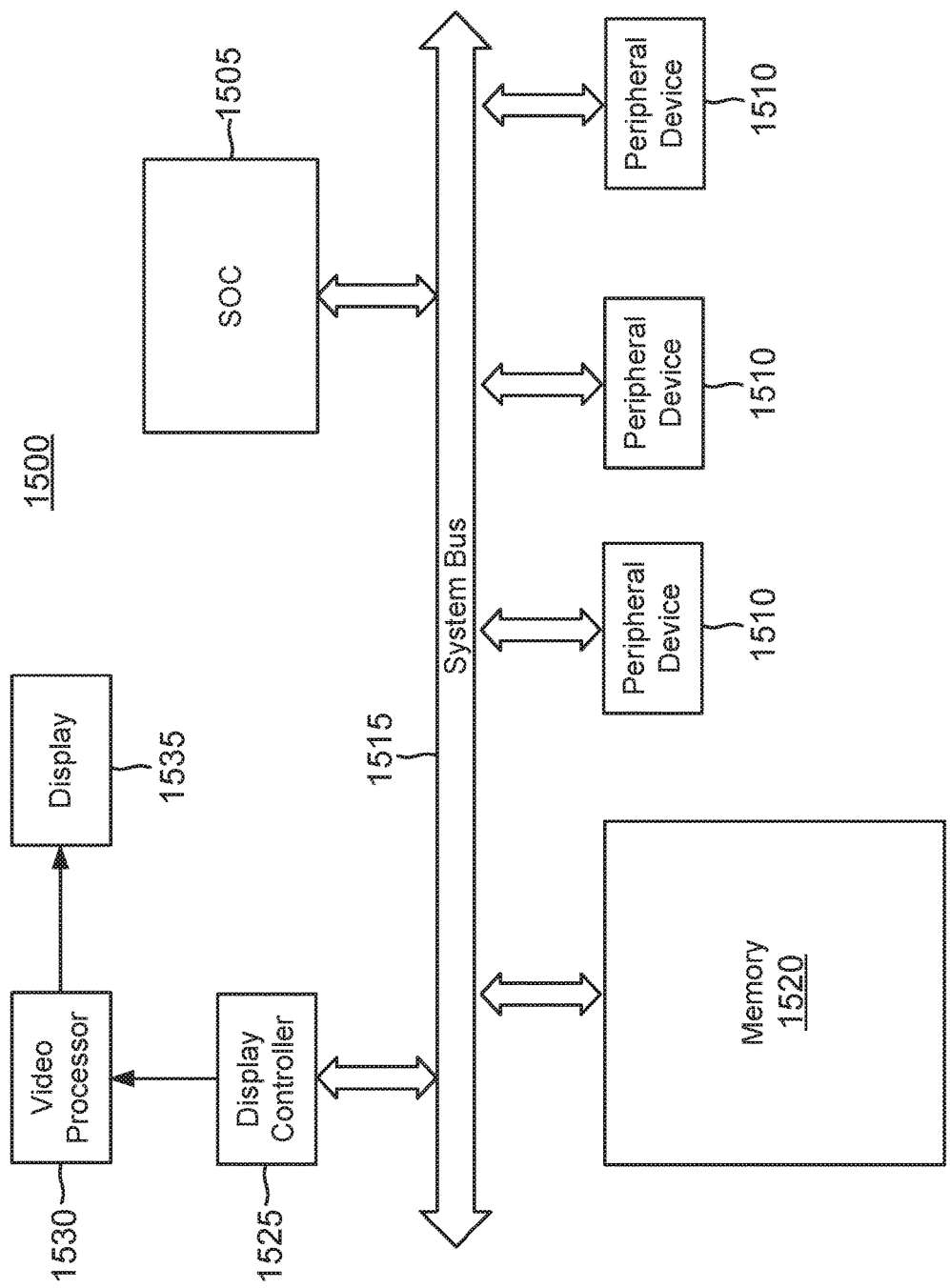
FIG. 15 illustrates an example system including the hybrid virtual architecture of FIG. 5.

An example system 1500 is shown in FIG. 15 that includes a system-on-a-chip (SoC) 1505 that is configured to communicate over a hybrid virtual GPIO interface (not illustrated) as disclosed herein with a plurality of peripheral devices 1510. Each peripheral device 1510 thus also includes a hybrid virtual FSM (not illustrated) as disclosed herein. System 1500 may comprise a cellular phone, smart phone, personal digital assistant, tablet computer, laptop computer, digital camera, handheld gaming device, or other suitable device. In addition to using its hybrid virtual FSM to transmit messaging signals and virtual GPIO signals to peripheral devices 1510, SoC 1505 communicates over a system bus 1515 that also couples to a memory such as a DRAM 1520 and to a display controller 1525. Display controller 1525 in turn couples to a video processor 1530 that drives a display 1535.

As those of some skill in this art will by now appreciate and depending on the particular application at hand, many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

We claim:

1. A method, comprising:

receiving a set of GPIO signals at an GPIO interface from a first processor; transmitting a portion of the set of GPIO signals through dedicated GPIO pins to a remote processor;

serially transmitting over a dedicated transmit pin a remaining portion of the set of GPIO signals to the remote processor as virtual GPIO signals in first frames, wherein each first frame includes a first header that identifies the first frame as a virtual GPIO frame, and wherein the first headers are error-correction coded; and retrieving messaging signals from messaging signal registers written by the first processor and serially transmitting the retrieved messaging signals over the dedicated transmit pin to the remote processor in second frames, wherein each second frame includes a second header that identifies the second frame as a messaging frame, and wherein the second headers are error-correction coded.

2. The method of claim 1, wherein error encoding of the first headers and the second headers comprises a Hamming code.

3. The method of claim 2, wherein the Hamming code is an (8,4) Hamming code.

4. The method of claim 1, wherein serially transmitting the retrieved messaging signals comprises serially transmitting retrieved universal asynchronous receiver transmitter (UART) signals.

5. The method of claim 1, wherein serially transmitting the retrieved messaging signals comprises serially transmitting retrieved serial peripheral interface (SPI) signals.

6. An integrated circuit, comprising:

a first processor;

a plurality of messaging signal registers, wherein the first processor is configured to write a transmit set of messaging signals into the messaging signal registers;

a plurality of GPIO pins;

a GPIO interface configured to receive a first set of signals from the first processor and to transmit a portion of the first set of signals as GPIO signals to a remote processor over the plurality of GPIO pins;

a dedicated transmit pin; and a logic circuit configured to receive a remaining portion of the first set of signals from the GPIO interface and to serially transmit the remaining portion as a transmit set of virtual GPIO signals organized into frames to the remote processor over the dedicated transmit pin, wherein the logic circuit is further configured to retrieve the transmit set of messaging signals from the messaging signal registers and to serially transmit the transmit set of messaging signals to the remote processor organized into frames over the dedicated transmit pin, and wherein the logic circuit is further configured to append an error-correction coded header to each frame that identifies whether the frame comprises virtual GPIO signals or messaging signals.

7. The integrated circuit of claim 6, wherein the error-correction coded header comprises a Hamming code.

8. The integrated circuit of claim 7, wherein the Hamming code is an (8,4) Hamming code.

* * * * *